US010826485B2

(12) United States Patent
Randolph et al.

(10) Patent No.: US 10,826,485 B2
(45) Date of Patent: Nov. 3, 2020

(54) CASCODE COMPOUND SWITCH SLEW RATE CONTROL

(71) Applicant: Analog Devices International Unlimited Company, Limerick (IE)

(72) Inventors: Hezekiel Dakjung Randolph, Sunnyvale, CA (US); Michael George Negrete, Mountain View, CA (US)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/222,700

(22) Filed: Dec. 17, 2018

(65) Prior Publication Data

US 2020/0195245 A1 Jun. 18, 2020

(51) Int. Cl.
*H03K 17/687* (2006.01)
*H03K 17/16* (2006.01)

(52) U.S. Cl.
CPC .................. *H03K 17/165* (2013.01)

(58) Field of Classification Search
CPC ............ H03K 17/168; H03K 2017/6875
USPC .... 327/430, 436, 170, 108–112; 326/82, 83, 326/87
See application file for complete search history.

(56) References Cited

U.S. PATENT DOCUMENTS

| 4,523,111 | A | 6/1985 | Baliga |
| 5,053,653 | A | 10/1991 | Bowers et al. |
| 7,348,826 | B1 * | 3/2008 | Klein ............... H03K 17/08148 327/421 |
| 7,782,118 | B2 | 8/2010 | Reichl et al. |
| 8,400,222 | B2 | 3/2013 | Bracale et al. |
| 8,578,143 | B2 | 11/2013 | Frank et al. |
| 8,847,235 | B2 * | 9/2014 | Rose ............... H03K 17/08122 257/76 |
| 9,083,343 | B1 * | 7/2015 | Li ..................... H03K 17/063 |
| 9,148,139 | B2 | 9/2015 | Bhalla et al. |
| 9,472,549 | B2 | 10/2016 | Rose et al. |
| 2001/0024138 | A1 | 9/2001 | Dohnke et al. |
| 2002/0153938 | A1 | 10/2002 | Baudelot et al. |
| 2004/0047098 | A1 | 3/2004 | Friedrichs et al. |
| 2013/0293268 | A1 | 11/2013 | Draxelmayr et al. |
| 2014/0027785 | A1 | 1/2014 | Rose |
| 2014/0091852 | A1 | 4/2014 | Norling et al. |

(Continued)

OTHER PUBLICATIONS

Aggeler, Daniel, et al., "Controllable dv/dt Behaviour of the SiC MOSFET/JFET Cascode: An Alternative Hard Commutated Switch for Telecom Applications", IEEE APEC, Palm Springs, CA, USA, (Feb. 2010), 8 pgs.

(Continued)

*Primary Examiner* — Tomi Skibinski
(74) *Attorney, Agent, or Firm* — Schwegman Lundberg & Woessner, P.A.

(57) ABSTRACT

A high-voltage (HV) compound switch can include coupling circuitry to help provide better slew rate (dV/dt) control, such as to limit electromagnetic energy radiation during switching, which can cause undesirable EMI. Further, efficiency and on-state resistance can be improved by controllably forward-biasing the "normally on" JFET when the compound switch is in an "on" state. In such an on-state, the JFET temperature can be monitored, such as by monitoring the gate-source junction voltage or the gate current of the JFET. Such temperature information can be used for control or other purposes.

22 Claims, 13 Drawing Sheets

(56) References Cited

U.S. PATENT DOCUMENTS

2014/0285178 A1    9/2014  Williams
2020/0195246 A1    6/2020  Randolph et al.

OTHER PUBLICATIONS

Aggeler, Daniel, et al., "Dv/dt-control methods for the SiC JFET/ Si MOSFET cascode", IEEE Transactions on Power Electronics, vol. 28, No. 8, (Aug. 2013), 10 pgs.
"U.S. Appl. No. 16/222,749, Restriction Requirement dated Jan. 30, 2020", 7 pgs
"International Application Serial No. PCT/EP2019/085440, International Search Report dated Feb. 21, 2020", 5 pgs.
"International Application Serial No. PCT/EP2019/085440, Written Opinion dated Feb. 21, 2020", 8 pgs.
"International Application Serial No. PCT/EP2019/085448, International Search Report dated Feb. 21, 2020", 5 pgs.
"International Application Serial No. PCT/EP2019/085448, Written Opinion dated Feb. 21, 2020", 11 pgs.
"U.S. Appl. No. 16/222,749, Non Final Office Action dated Apr. 29, 2020", 13 pgs.

\* cited by examiner

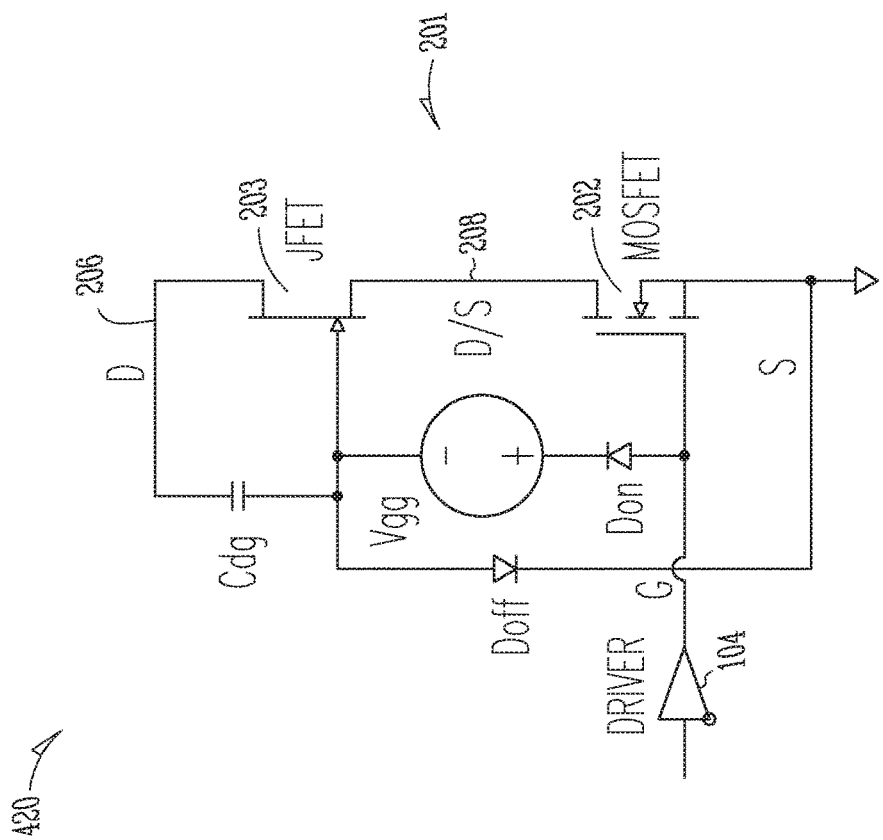
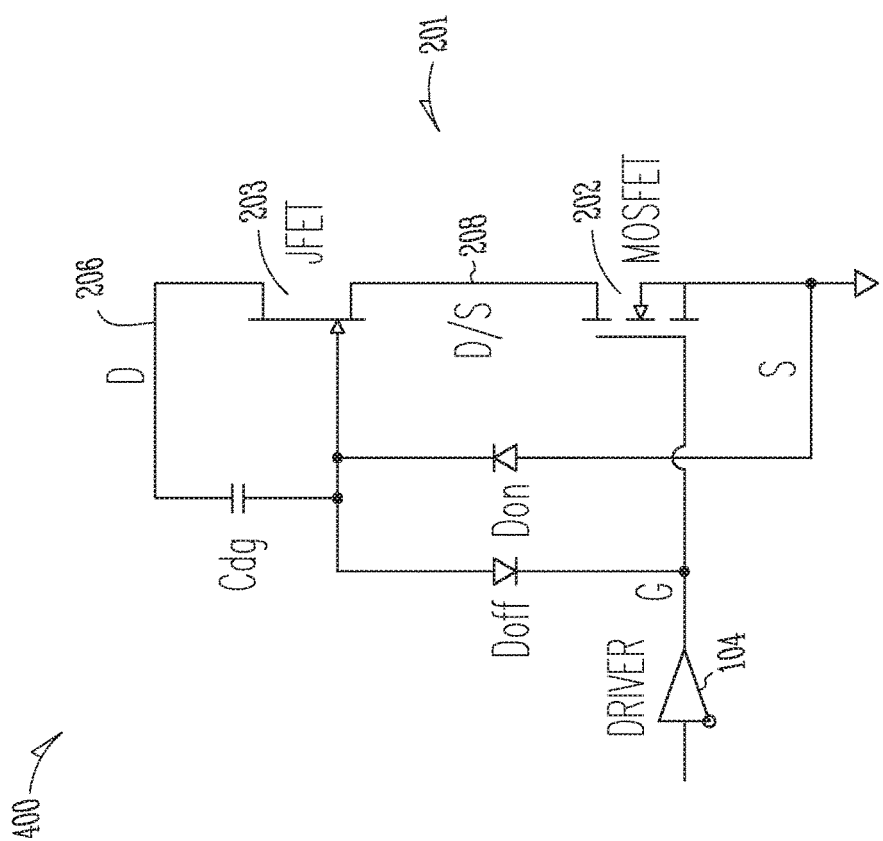

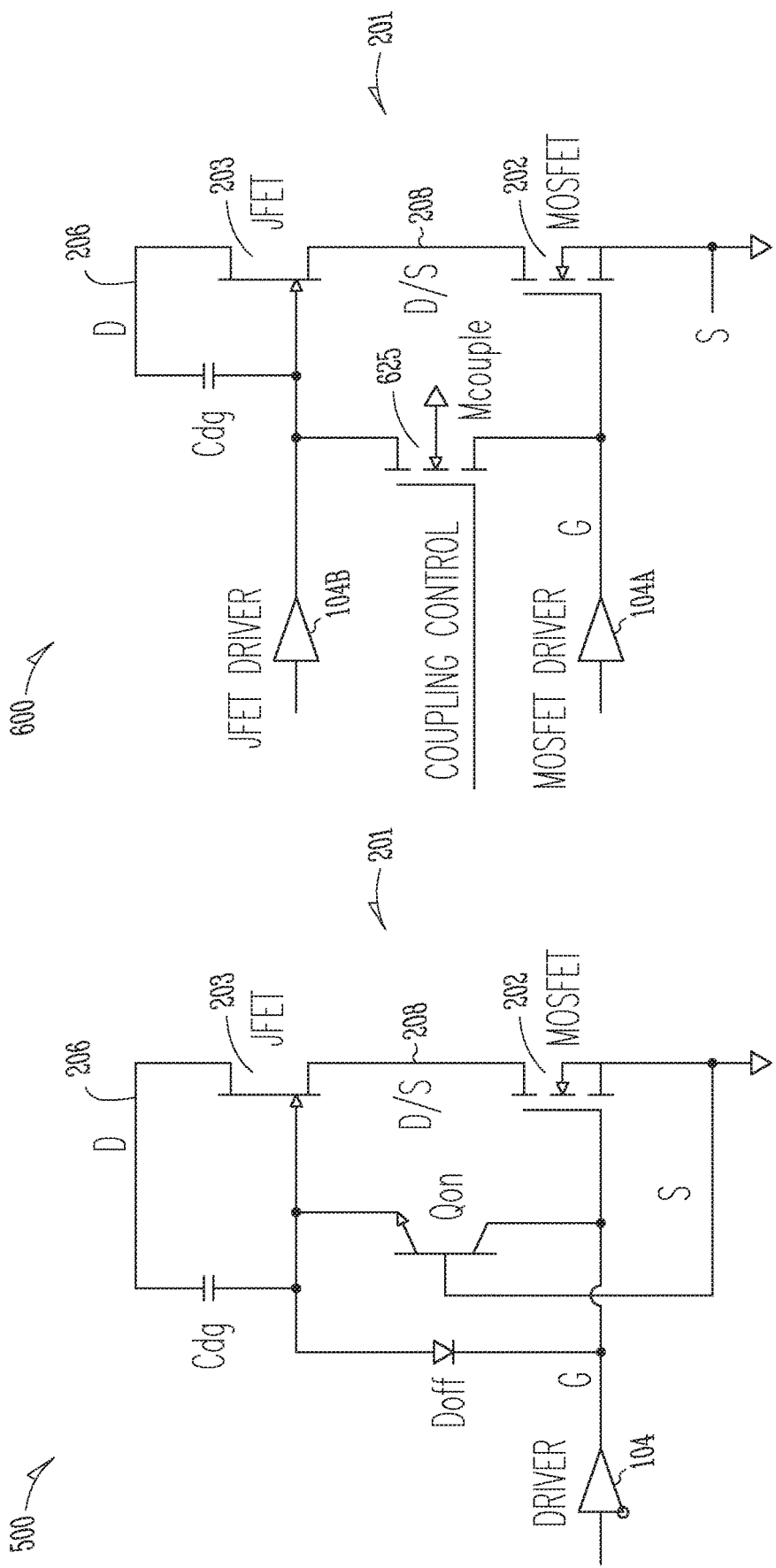

US 10,826,485 B2

CASCODE COMPOUND SWITCH SLEW RATE CONTROL

TECHNICAL FIELD

This document pertains generally, but not by way of limitation, to electronic circuits, and more particularly, but not by way of limitation, to devices, circuitry, and methods for cascode compound switch operation, such as can include slew rate control, including for high voltage (HV) switching applications needing electromagnetic compatibility (EMC).

BACKGROUND

A field-effect transistor (FET) or other transistor can be used as a switch that can be capable of transitioning very rapidly between an "off" state, in which very little current flows through the transistor device despite a voltage applied across its conduction terminals, and an "on" state, in which the voltage across such transistor conduction terminals can be desired to be very small despite the current that flows through the transistor between such transistor conduction terminals. This switch behavior of operating a transistor can be controlled by selecting an appropriate voltage applied to the transistor's control terminal, such as the gate terminal of a FET, while the FET's conduction terminals, such as the drain and source terminals of a FET, are responsible for performing the switching action providing the ideally electrically conductive "on" state and the electrically non-conductive "off" state.

Transistors can be used as switches that can be switched rapidly between "on" and "off" states, such as for the purpose of electrical power conversion, e.g., using a switched-mode power converter, or for the purpose of electric motor control. For certain high power delivery applications, it is necessary to use a high-voltage switch that should be capable of conducting a very small current in the "off" state despite a large voltage being applied across the conduction terminals (e.g., FET drain and source terminals) of the transistor, and large current in the "on" state with very little voltage drop across the conduction terminals.

SUMMARY

In the pursuit of this objective, one approach is to create a cascode compound switch, comprised of two switches in series: a normally "on" high-voltage transistor (HVT) designed to achieve the goals of large "off" state voltage and large "on" state current, and a normally "off" low-voltage transistor (LVT) designed to commutate the HVT between its "on" and "off" states. These two transistors can be constructed out of different materials: the HVT out of a wide-bandgap (WBG) semiconductor such as gallium nitride (GaN) or silicon carbide (SiC), and the LVT out of a lower-cost material such as silicon (Si).

Unfortunately, such cascode compound switches often suffer from excessively rapid transitions while switching between "on" and "off" states. These rapid transitions, also known as high slew rates, can cause unwanted electromagnetic interference (EMI) or, in the case of motor drives, damage to the insulation between the conductive wires used for the motor windings.

The present inventors have recognized, among other things, that a problem exists in many switching applications, particularly in high voltage switching applications, in which it can be desirable to switch one or more transistors very rapidly such as, for example, for the purpose of electrical power conversion. For example, for high power delivery, it can be necessary to use high-voltage transistor switches that are capable of conducting zero current between switch conduction terminals in the "off" state, despite a large voltage being applied across these switch conduction terminals, such as the drain and source terminals of a FET.

Unfortunately, as recognized by the present inventors, switching too rapidly can cause electromagnetic energy to be radiated from the circuit, which can cause electromagnetic interference (EMI), which, in turn, can potentially violate government regulations on electromagnetic emission. In particular, the changing voltage ($V_{ds}$) across the conduction terminals (e.g., drain and source) of the switching device as it transitions between "off" and "on" states can cause displacement currents through parasitic circuit capacitances. Such displacement currents are then converted into EMI by the circuit's physical structure, similar to a miniature version of an antenna. The magnitude of these displacement currents is proportional to the rate of change of the voltage with respect to time (dV/dt or "slew rate") of the switching node. Therefore, as recognized by the inventors, in certain applications it can be of interest to control the dV/dt, such as to reduce these displacement currents during switching, which, in turn, can help reduce EMI. In other applications, such as electric motor control, controlling the dV/dt or limiting the slew rate of switching can help protect the insulation between motor windings.

In an approach to switching, an enhancement mode (e.g., normally "off" in the absence of an applied positive control voltage) metal-oxide-semiconductor FET (MOSFET) or other FET or other transistor switch can be used, such using a driver circuit to drive a gate control terminal of the MOSFET. (Note: this document recognizes that a MOSFET need not have a "metal" gate, e.g., a polysilicon or other such gate is intended to be included in the term MOSFET as would be understood by one skilled in the art, similarly a MOSFET need not have an "oxide" insulator adjacent to the gate, e.g., a silicon nitride or other gate insulator is intended to be included in the term MOSFET as would be understood by one skilled in the art). In driving a MOSFET with an inverter circuit or other gate driver circuit, some degree of dV/dt control at the drain terminal of such a FET can be obtained naturally by the drain-to-gate capacitance ($C_{dg}$) of the FET. This drain-to-gate capacitance, $C_{dg}$, Can be conceptualized as an intrinsic "Miller" capacitance, and it causes a displacement current in the FET's gate as the drain voltage at the drain terminal of the FET changes, such as during the switching of the FET from "off" to "on" or from "on" to "off," as explained in more detail below. The gate driver circuit can be designed to be "current-limited" such as to limit the amount of current it can supply to accommodate this charging or discharging of the Miller capacitance $C_{dg}$ of the FET, which can provide a degree of slew rate (dV/dt) control, which, in turn, can help limit EMI to an acceptable level.

However, as recognized by the present inventors, it can be desirable to add another transistor (a "cascode" transistor) in series with the switching transistor to form a "compound switch" that can withstand ("stand off") a greater drain voltage when the compound switch is "off" than would otherwise be the case if a single transistor were used for switching instead; such a two-transistor compound switch can include the switching low voltage transistor (LVT) and the cascode high voltage transistor (HVT). Many such high voltage (HV) switching applications exist, including for electric-powered automotive motor control, for example. But as recognized by the present inventors, the inclusion of a cascode transistor in the compound switch isolates the Miller capacitance $C_{dg}$ of the HVT from the driver current provided by a gate driver circuit driving the switching transistor of the compound switch, such that in the absence of the present techniques, the slew rate (dV/dt) of the compound switch may not be well-controlled, and may emit more electromagnetic energy than desired, causing EMI problems that may not be acceptable in view of government regulations or a particular application's requirements.

To help address these and other problems, the present inventors have recognized that a compound switch can be provided with additional circuitry to help provide better slew rate (dV/dt) control of the compound switch, such as to limit electromagnetic energy radiation during switching for EMI reduction, to help protect motor windings in an electric motor application, or the like. The additional slew rate control circuitry can be configured to provide slew rate control for only one of the "on" to "off" transition or the "off" to "on" transition of the compound switch, or for both transitions, as explained further herein. The slew rate control circuitry can include diode or transistor coupling, and can include independent control of the cascode and switching transistor devices forming the compound switch. The slew rate control circuitry can be configured to control a depletion mode (e.g., normally "on") junction field-effect transistor (JFET) or other FET or other cascode transistor of the compound switch (or other wide-bandgap semiconductor cascode switch) such as can be useful in certain HV applications to provide a high stand-off voltage when the compound switch is "off".

Further the present inventors have also recognized that efficiency and on-state resistance can be improved by controllably forward-biasing the "normally on" HVT when the compound switch is in an "on" state. Specifically, by driving the HVT's gate positive in the "on" state, its resistance is reduced and its saturation current is increased. In the case where the HVT is a junction field-effect transistor (JFET), in such an on-state, the JFET temperature can be monitored, such as by monitoring the gate-source junction voltage or the gate current of the JFET. Such temperature information can be used for control, efficiency optimization, fault monitoring, or other purposes.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 4A, 4B, and 4C show respective examples of various switching approaches that can use a compound switch, such as for providing independent or asymmetric slew rate control of one or both switching transitions.

FIG. 5 shows an example of a switching approach in which the coupling circuitry can include one or more transistors, in addition or as an alternative to one or more of the diodes shown in the examples of FIG. 4A, 4B, or 4C.

FIG. 6 illustrates an example of a switching approach in which the coupling circuitry can include a coupling transistor, such as can provide a desired amount of coupling between the control terminals of the LVT and the HVT of the compound switch, such as only during switching transitions, if desired, with different, separate, or independent control voltage levels being available for use by the coupling transistor or for being supplied to the HVT, or both.

DETAILED DESCRIPTION

The present inventors have recognized, among other things, that a high-voltage (HV) compound switch can be provided with additional circuitry to help provide better slew rate (dV/dt) control of the compound switch, such as to limit electromagnetic energy radiation during switching, which can cause undesirable EMI. The additional slew rate control circuitry can be configured to provide slew rate control for only one of the "on" to "off" transition or the "off" to "on" transition of the compound switch, or for both transitions, as explained further herein. The slew rate control circuitry can include diode or transistor coupling, and can include independent control of the cascode and switching transistor devices forming the compound switch. The slew rate control circuitry can be configured to control a depletion mode (i.e., normally "on") junction field-effect transistor (JFET) or other FET or other cascode transistor of the compound switch (or other wide-bandgap semiconductor cascode switch) such as can be useful in certain HV applications to provide a high stand-off voltage when the compound switch is "off".

Further, efficiency and on-state resistance can be improved by controllably forward-biasing the "normally on" JFET when the compound switch is in an "on" state. In such an on-state, the JFET temperature can be monitored, such as by monitoring the gate-source junction voltage or the gate current of the JFET. Such temperature information can be used for control or other purposes.

Controlling Cascode Compound Switch Slew Rate

Figure 1A:
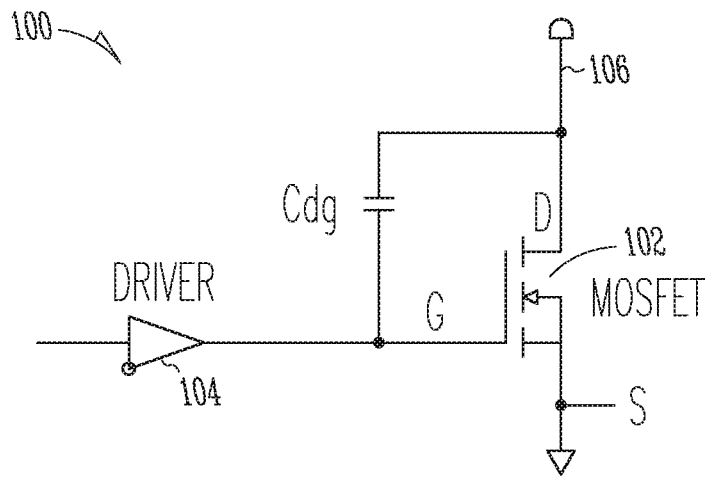
FIG. 1A shows an example of a single-transistor approach of switching as opposed to a compound switch.

FIG. 1A shows an example, for comparison, of a single-transistor approach 100 of switching as opposed to a compound switch. In FIG. 1A, an enhancement mode (normally "off") switching FET 102 can include a control or gate terminal, and can include first and second conduction terminals. The switch conduction terminals can include a drain terminal that can be connected to a node 106 to be switched and a source terminal that can be connected to a ground or other reference node, such as shown in FIG. 1A. The switching FET 102 can have its gate terminal G driven by a driver circuit 104. The driver circuit 104 can include, for example, an inverter circuit, a non-inverting buffer circuit, or the like. The gate-drain capacitance $C_{dg}$ of the switching transistor is shown explicitly in FIG. 1A, however, $C_{dg}$ need not be a separate capacitor, but can instead be the intrinsic gate-drain capacitance of the switching FET 102 itself.

In the example of FIG. 1A, when switching FET 102, dV/dt slew rate control of the node 106 to be switched can be obtained naturally. The $C_{dg}$ of FET 102 causes a displacement current in the gate of FET 102 as the voltage at the drain of FET 102, at node 106, changes with respect to the stable ground or other reference voltage at the source of the FET 102. This displacement current during switching is provided by the gate driver circuit 104. The gate driver circuit 104 can be configured to be "current-limited," such as to have a well-controlled and limited current driving capability, such as can be established by selecting an appropriate width/length sizing for a particular process transconductance of a pull-up FET or pull-down FET, or both, which are coupled to the output of the driver circuit 104 and to the gate terminal of the switching FET 102. When the gate driver circuit 104 is current-limited, the dV/dt slew rate of the drain at node 106 of the switching FET 102 can be controlled directly by the current as:

$$dV/dt = I_{gate}/C_{dg} \quad \text{Equation 1}$$

because of the "Miller feedback" phenomenon.

Figure 1B:
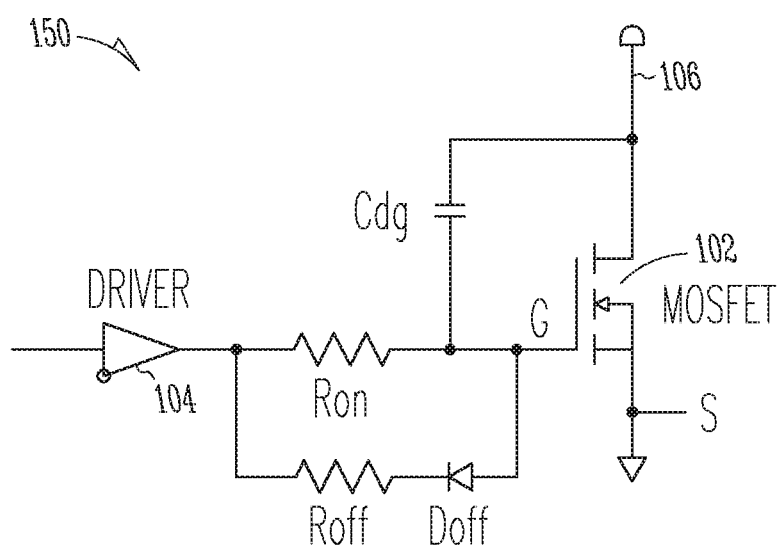
FIG. 1B shows an example of another single-transistor approach of switching, as opposed to a compound switch.

FIG. 1B shows an example of another single-transistor approach 150 of switching, as opposed to a compound switch. In the example of FIG. 1B, a resistance can be added between the driver 104 and the gate G of the FET 102 to control current. In the example of FIG. 1B, the sourcing current of the driver 104 is limited by the resistance $R_{on}$ placed between the output of the driver 104 and the gate G of the FET 102. The sinking current of the driver 104 is limited by the parallel combination of $R_{on}$ and $R_{off}$. In the example of FIG. 1B, the diode $D_{off}$ is in series with $R_{off}$, with this series combination of $R_{off}$ and $D_{off}$ being arranged in parallel with the resistance $R_{on}$. The diode $D_{off}$ will conduct for a portion of the switching of the gate G of 102 from high to low, providing a parallel path through $R_{off}$, such that the current-sinking of the driver 104 can be limited by a lesser resistance ($R_{on}$ in parallel with $R_{off}$) than the current-sourcing of the driver 104, which is limited only by $R_{on}$ since the diode $D_{off}$ is off when the gate G of FET 102 is being switched from low to high. Thus, in the example of FIG. 1B, the current of the gate driver circuit 104, and therefore the dV/dt of the node 106, can be controlled by the resistances $R_{on}$ and $R_{off}$, and the "Miller plateau" of the switching FET 102, which occurs due to the $C_{dg}$ Miller feedback between the drain and gate of the switching FET 102. In the example of FIG. 1B, the positive dV/dt of node 106 and the negative dV/dt of node 106 need not have the same value, as explained above, because of the different values of the sourcing and sinking currents established by $R_{on}$ and by the parallel combination of $R_{on}$ and $R_{off}$.

Figure 2:
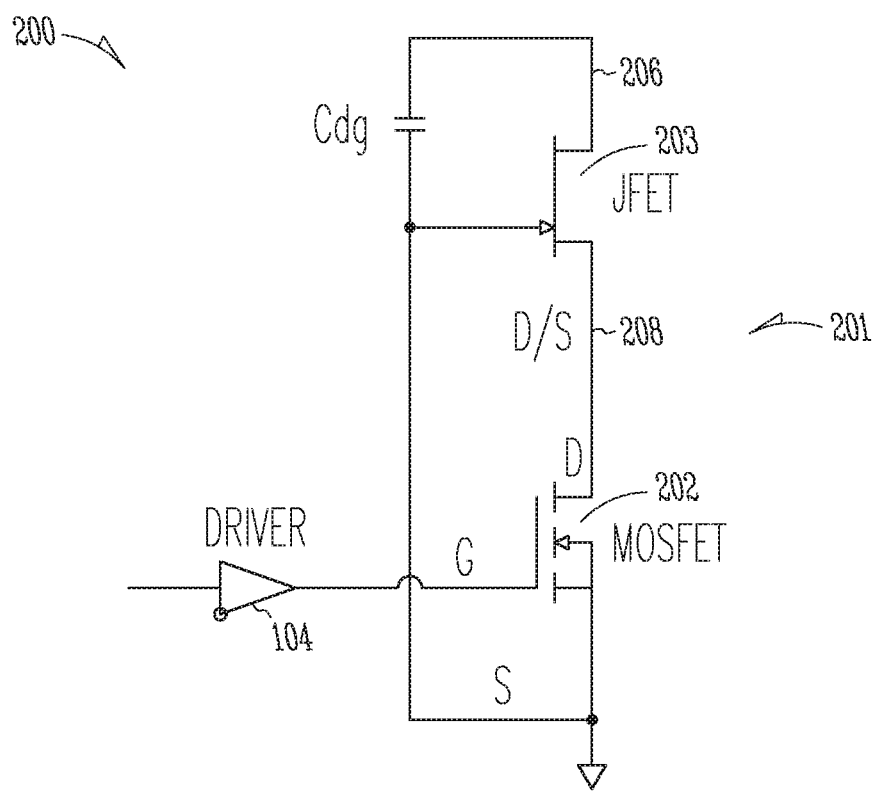
FIG. 2 illustrates an example of a switching approach that can include a compound switch, such as can include a low voltage transistor (LVT) in series with a high voltage transistor (HVT).

FIG. 2 illustrates an example of a switching approach 200 that can include a compound switch 201. The compound switch can include an enhancement mode (normally "off") low voltage transistor (LVT) such as switching FET 202 or other transistor (e.g., bipolar, field-effect, or the like) in series with a cascode high voltage transistor (HVT), such as the cascode depletion mode (normally "on") JFET 203 or other cascode transistor (e.g., MOSFET, HEMT, or other field-effect or other transistor or the like). A depletion mode JFET 203 or other type of depletion mode HVT can help improve the standoff voltage of the compound switch, that is, the amount of voltage between the switching node 206 and the ground or reference node to which the source of the switching FET 202 is coupled when the compound switch formed by 202, 203 is in the "off" state. The depletion mode cascode JFET 203 can be fabricated using a different type of semiconductor than the switching FET 202. For example, the depletion mode cascode JFET 204 can include a wide bandgap semiconductor material to help improve the standoff voltage across the depletion mode cascode JFET 203 and, in turn, across the compound switch 201. Such a wide bandgap semiconductor material of the JFET 203 can include a compound semiconductor, such as GaN or SiC, for example. Wide bandgap semiconductor JFETs are readily available as depletion mode devices; however, while JFETs are emphasized herein, other types of transistors can be used.

As shown in the example of FIG. 2, it can be desirable to construct a compound transistor switch ("compound switch") 201, such using a low-voltage enhancement-mode (normally "off") switching FET 202 (LVT) in series with a high-voltage normally-on JFET 203 or other high voltage FET (HVT) or other HVT. The JFET 203 is capable of withstanding large voltages in its off-state, but because it is normally-on (e.g., it requires a negative gate-source voltage to turn off), the normally-off enhancement-mode MOSFET switching FET 202 is included in series with the source of the JFET 203.

If the FET 202 is turned off by placing zero volts on its gate G, the drain of FET 202 at node 208 charges up to the (positive) voltage needed for the JFET 203 to turn off, as this causes the JFET 203 to experience a negative gate-source voltage. As explained above, this series cascode arrangement of FET 202 and JFET 203 has the benefit of allowing different semiconductor materials to be used for each of these devices, each can be selected or configured for its specific use. However, the drain-to-gate charge of the JFET 203 is shunted directly to the source of the compound transistor 201 at the source terminal of FET 202 (via the connection of the gate of the JFET 203 to the source of the FET 202, as shown in FIG. 2) rather than feeding back to the gate G of the FET 202, which is connected to the output of the gate driver circuit 104. Thus, in the example of FIG. 2, it can be said that the JFET 203 is shielding the gate G of the FET 202 from its drain voltage at the drain of the FET 202 at node 208. Thus, the FET 202 (and, in turn, the compound transistor 201) shown in FIG. 2 does not experience Miller feedback from its switching node 206 to the gate node G. This can cause a large, poorly-controlled dV/dt of the switching node 206, and resulting EMI, even if the gate current provided by the driver circuit 104 is controlled.

Figure 3A:
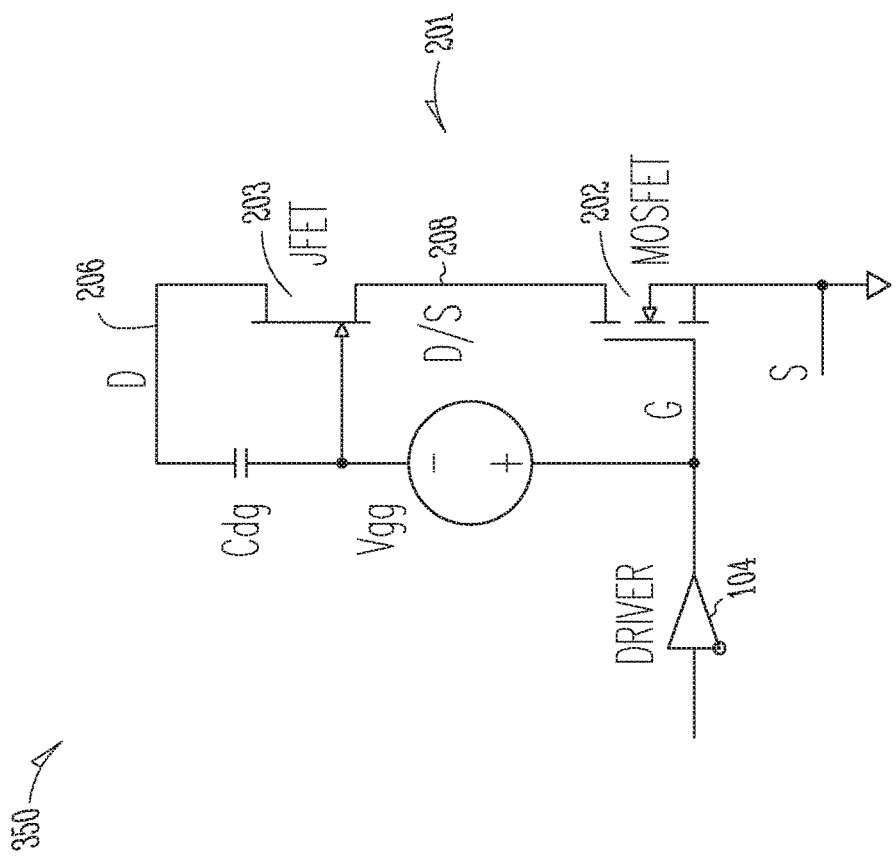
FIG. 3A shows an example of a switching approach, such as can include a compound switch with a control terminal of the HVT being electrically connected to a control terminal of the LVT.

FIG. 3A shows an example of a switching approach 300, such as can include a compound switch 201 with the gate of the JFET 203 being electrically connected to the gate G of the FET 202, rather than to the source of the FET 202, as was shown in the example of FIG. 2. The switching approach 300 shown in FIG. 3A can help solve certain problems with the switching approach 200 such as explained above with respect to FIG. 2. As shown in FIG. 3A, charging or discharging of the $C_{gd}$ of the JFET 203, during switching, is provided by gate driver 104 that is driving the FET 202, which can leverage the Miller feedback behavior described with respect to FIG. 1A to control the slew rate dV/dt of the switched node 206. As described above with respect to FIG. 1A, the dV/dt of the drain node 206 of the JFET 203 is limited in the example of FIG. 3A by the same gate drive current from the output of the driver circuit 104 that charges the gate G of the FET 202. However, in the example of FIG. 3A, when FET 202 is on (when the gate G of FET 202 is driven to a positive voltage), the gate-source junction diode of the depletion mode JFET 203 turns on and conducts current between the gate and source of the JFET 203. This can have two undesirable effects. First, it can incur a large amount of current draw and power waste. Second, it can leave the gate driver circuit 104 unable to drive the gate G of the FET 202 fully positive (e.g., to the upper power supply voltage being supplied to power the driver circuit 104), causing the FET 202 to have a greater "on" resistance than would be the case if the voltage at the node G of the FET 202 were not so limited. Because of these undesirable effects, the approach of FIG. 3A may not find useful applications.

Figure 3B:
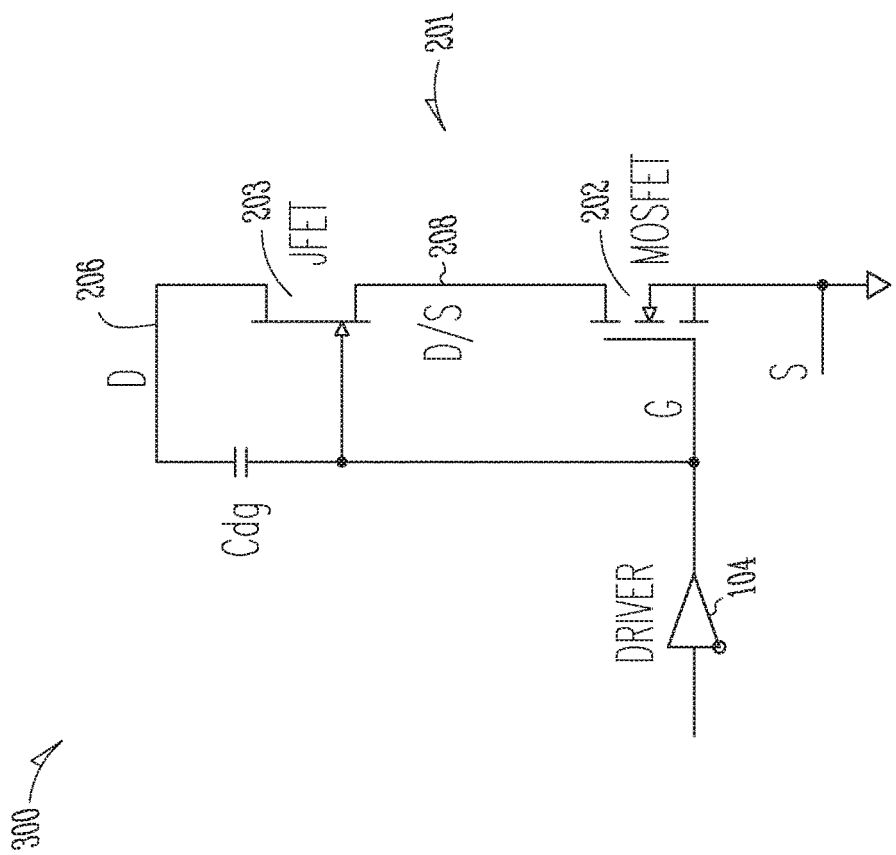
FIG. 3B shows an example of a switching approach, similar to that shown in FIG. 3A, but which couples a control terminal of the HVT to a gate driver while permitting a voltage difference between the control terminals of the HVT and the LVT.

FIG. 3B shows an example of a switching approach 350, similar to that shown in FIG. 3A, but which recognizes that it can be desirable to have the $C_{dg}$ of the JFET 203 provided by the gate driver circuit 104, but to permit a voltage difference between the voltage at the gate node G of the FET 202 and the voltage at the gate of the JFET 203. Such a voltage difference can be provided by including coupling circuitry, such as between the output of the driver circuit 104 and the gate of the JFET 203, that can provide an offset voltage (represented conceptually in FIG. 3B by the voltage source $V_{gg}$). The offset voltage $V_{gg}$ as shown in FIG. 3B, appears between the gate G of the FET 202 and the gate of the JFET 203.

If the offset voltage $V_{gg}$ is large enough, then the gate G of the FET 202 can be driven fully positive while maintaining the voltage at the gate of the JFET 203 low enough to avoid turning on the gate-source junction of the depletion mode JFET when the compound switch 201 is in its "on" state, avoiding excess current draw and power consumption, and permitting the gate G of the FET 202 to be positive enough to obtain a low "on" resistance of the FET 202 when the compound switch 201 in FIG. 3B is in its "on" state. Further, in the example of FIG. 3B, the Miller feedback of the JFET 203 will allow the slew rate dV/dt of the node 206 to be well-controlled by the gate drive current provided by the current-limited driver circuit 104, which can help reduce EMI, without causing the undesired behavior described above with respect to FIG. 3A. To generate the offset voltage $V_{gg}$, one or more diodes, transistors, or switches can be used, as further described herein. The offset voltage $V_{gg}$ need not be constant—the offset voltage $V_{gg}$ is needed in the "on" state of the compound switch 201 shown in FIG. 3B to avoid gate-source junction turn-on of the depletion mode JFET 203, but a different or zero offset voltage $V_{gg}$ can be provided in the "off" state of the compound switch 201 shown in FIG. 3B. Further examples and explanation are provided below, including examples in which the offset voltage can be different between the "on" and "off" states of the compound switch, such as by appropriate configuration of the coupling circuitry between the output of the driver circuit 104 and one or both of the FET 202 or JFET 203.

FIG. 4A shows an example of a switching approach 400 that can use a compound switch 201 in which the coupling circuitry can include a first diode $D_{off}$ having its anode electrically connected or coupled to the gate of the JFET 203 and its cathode coupled to the gate G of the FET 202 as well as to the output of the driver circuit 104. The coupling circuitry can further include a second diode Dou having its anode coupled to the source of the FET 202 and having its cathode coupled to the gate of the JFET 203. One or both of $D_{off}$ or $D_{on}$ can include a series string of one or multiple diodes, such as to generate a desired magnitude of an offset voltage $V_{gg}$. In the switching approach 400 of FIG. 4A, only the turn-off of the compound switch 201 has a controlled dV/dt of the switching node at 206 by the current-limited gate driver 104, while the turn-on of the compound switch 201 does not have a controlled dV/dt of the switching node at 206.

In FIG. 4A, when the compound switch 201 is turning off, $D_{off}$ becomes forward biased and turns on to couple the gate and $C_{dg}$ of the JFET 203 to the output of the current-limited current driver circuit 104, which provides slew rate limiting of node 206 via the current-limited driver circuit 104 discharging $C_{gd}$, while $D_{on}$ is reverse-biased and remains off during this switching transition.

In FIG. 4A, when the compound switch 201 is turning on, $D_{off}$ is reverse biased and the gate of the JFET 203 is isolated from the output of the driver circuit. During this switching transition, the gate of the JFET 203 is coupled to the source of the FET 202, which is connected to a ground or other reference node, such that the $C_{dg}$ of the JFET 203 is charged via $D_{on}$ from the ground or other reference node, rather than via the current-limited driver circuit 104.

FIG. 4B shows an example of a switching approach 420 that can use a compound switch 201 in which the coupling circuitry can include a first diode $D_{off}$ having its anode electrically connected or coupled to the gate of the JFET 203 and its cathode coupled to the source of the FET 202 instead of to the output of the driver circuit 104. The coupling circuitry can further include a second diode $D_{on}$ having its anode coupled to the gate G of the FET 202 and also to the output of the driver circuit 104 and having its cathode coupled to the gate of the JFET 203, such as through an offset voltage generator $V_{gg}$, such as can include one or multiple diodes, in an example. One or both of $D_{off}$ or $D_{on}$ can include a series string of one or multiple diodes, such as to generate a desired voltage drop. In the switching approach 420 of FIG. 4B, only the turn-on of the compound switch 201 has a controlled dV/dt of the switching node at 206 by the current-limited gate driver 104, while the turn-off of the compound switch 201 does not have a controlled dV/dt of the switching node at 206.

In FIG. 4B, when the compound switch 201 is turning on, $D_{on}$ becomes forward biased and turns on to couple the gate of the JFET 203 to the output of the current-limited current driver circuit 104 to discharge $C_{dg}$ of the JFET 203, which provides slew rate limiting of node 206 via the current-limited driver circuit 104, while $D_{off}$ is reverse-biased and remains off during this switching transition.

In FIG. 4B, when the compound switch 201 is turning off, $D_{on}$ is reverse biased and the gate of the JFET 203 is isolated from the output of the driver circuit 104. During this switching transition, the gate of the JFET 203 is coupled via the forward biased $D_{off}$ to the source of the FET 202, which is connected to a ground or other reference node, such that the $C_{dg}$ of the JFET 203 is charged via $D_{off}$ from the ground or other reference node, rather than via the current-limited current driver circuit 104.

Figure 4C:
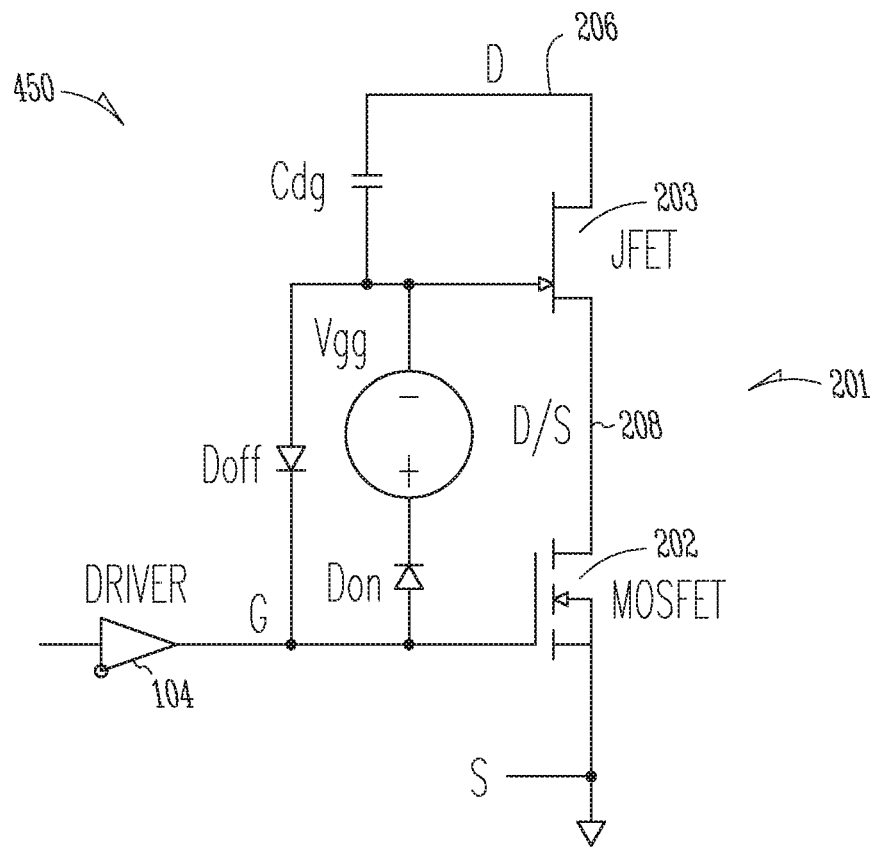

FIG. 4C shows an example of a switching approach 450 that can use a compound switch 201 in which the coupling circuitry can include a first diode $D_{off}$ having its anode electrically connected or coupled to the gate of the JFET 203 and its cathode coupled to the gate of the FET 202 as well as to the output of the driver circuit 104. The coupling circuitry can further include a second diode $D_{on}$ having its anode coupled to the gate G of the FET 202 and also to the output of the driver circuit 104 and having its cathode coupled to the gate of the JFET 203, through an offset voltage generator $V_{gg}$, such as can include one or multiple diodes, in an example. One or both of $D_{off}$ or $D_{on}$ can include a series string of one or multiple diodes, such as to generate a desired voltage drop. In the switching approach 450 of FIG. 4C, both the turn-on and the turn-off of the compound switch 201 have a controlled dV/dt of the switching node at 206 by the current-limited gate driver 104.

In FIG. 4C, when the compound switch 201 is turning on, $D_{on}$ becomes forward biased and turns on to couple the gate of the JFET 203 to the output of the current-limited current driver circuit 104 to discharge $C_{dg}$ of the JFET 203, which during this switching transition provides slew rate limiting of node 206 via the current-limited driver circuit 104, while $D_{off}$ is reverse-biased and remains off during this switching transition.

In FIG. 4C, when the compound switch 201 is turning off, $D_{on}$ is reverse biased but $D_{off}$ is forward biased such that the gate of the JFET 203 is coupled via the forward biased $D_{off}$ to the output of the driver circuit 104, such that the $C_{dg}$ of the JFET 203 is charged via the forward biased $D_{off}$ from the current-limited current driver circuit 104, thereby limiting the slew rate of node 206 during this switching transition.

As explained above, the amount of the offset voltage $V_{gg}$ can be selected or established so as to inhibit gate-source diode turn-on of the depletion mode JFET 203 when the compound switch 201 is "on", which could otherwise burn excess power and preclude obtaining a low "on" resistance of FET 202 and, in turn, of the compound switch 201.

FIG. 5 shows an example of a switching approach 500 in which the coupling circuitry can include one or more transistors, in addition or as an alternative to one or more of the diodes shown in the examples of FIG. 4A, 4B, or 4C. In the example of FIG. 5, a diode $D_{off}$ has its anode coupled to the gate of the JFET 203 and its cathode coupled to the output of the driver circuit 104 and to the gate G of the FET 202, in an arrangement similar to the manner shown and described above with respect to FIGS. 4A and 4C, such as for providing slew-rate dV/dt control of the node 206 via the current limited driver circuit 104 when the compound switch 201 is turning-off. A transistor, such as an npn bipolar junction transistor (BJT) $Q_{on}$ replaces the diode $D_{on}$ of FIG. 4C, such as with its emitter coupled to the gate of the JFET 203, its collector coupled to the output of the driver circuit 104 and to the gate G of the FET 202, and its base coupled to the source of the FET 202, which, in turn, can be coupled to the ground or other reference node such as shown in FIG. 5.

In the example of FIG. 5, the gate of the JFET 203 is coupled to the gate G of the FET 202 by the BJT $Q_{on}$ only when the gate voltage of the JFET 203 falls below the source voltage of the FET 202, as controlled by the base of the BJT $Q_{on}$ being coupled to the source of the FET 202. This allows the gate G of the FET 202 to be driven fully positive without turning on the gate-source diode of the depletion mode JFET 203 in the "on" state of the compound switch 201, and the BJT $Q_{on}$ automatically stands off the required voltage.

Variations on the example shown in FIG. 5 can include using a MOSFET or a BJT or another type of transistor for $Q_{on}$, driving the control terminal (e.g., gate or base) of $Q_{on}$ with a programmed or other specified voltage or even an adjustable voltage. In a variation, the diode $D_{off}$ can be replaced by an appropriate transistor in a similar manner analogous to that shown for replacing $D_{on}$ by $Q_{on}$ in FIG. 5. In an additional or alternative variation, a single BJT or FET or other transistor can be used to serve the role of both turn-on and turn-off diodes such as by providing a selective coupling of the JFET 203 to a current-limited driver circuit 104 to provide the desired charging or discharging of the $C_{dg}$ of the JFET 203 and, in turn, the desired slew rate controlled dV/dt of the switching node 206. This can help inhibit EMI, as explained herein. In an additional variation, the fraction of JFET 203 gate current that is coupled to the driver 104 can be adjusted, such as by reducing the current gain (beta) of the coupling transistor $Q_{on}$, either by employing semiconductor processing techniques or by synthesizing a transistor of a desired beta using multiple transistors using existing "current mirror" type circuit techniques familiar to those skilled in the art. Reduction of beta causes a greater share of the gate current of JFET 203 to be provided by the base current of the coupling transistor $Q_{on}$, rather than by the driver circuit 104. A reduced beta transistor can be synthesized either using bipolar junction transistors, FETs, or another transistor type.

FIG. 6 illustrates an example of a switching approach 600 in which the coupling circuitry can include a coupling transistor, such as coupling FET 625, which can have its conduction terminals located between the gate of the JFET 203 and the output of the MOSFET driver circuit 104A, which is also connected to the gate G of the FET 202. A separate JFET driver circuit 104B can be included to drive the gate of the JFET 203 to desired respective voltages in the "on" and "off" states of the compound switch 201. The separate JFET driver circuit 104B can be supplied power from a different (e.g., higher in voltage, or lower in voltage, upper supply rail) power supply than the power supply being provided to the MOSFET driver circuit 104A. One or both of the driver circuits 104A-B can be current-limited, such as by appropriate selection of one or both of an output pullup or pulldown transistor within one or both of the driver circuits 104A-B. For example, the JFET driver circuit 104B can include an output pullup transistor that is sized to be current-limited such that its output voltage at the gate of the JFET 203 takes on whatever particular voltage that the JFET 203 will permit.

The coupling FET 625 need only be "strobed" or similarly briefly turned-on during a desired one or both of the switching transitions of the compound switch 201 in FIG. 6 from "on" to "off" or from "off" to "on", without the coupling FET 625 being required to remain on during one or both of the "on" state or the "off" state of the compound switch 201 after the transition into such state has been accomplished. The voltage applied to the gate terminal of the coupling FET 625 need not be limited to fall within the upper and lower power supply rails (e.g., $V_{DD}$, $V_{SS}$) used for supplying the MOSFET driver circuit 104A. For example, the coupling FET 626 can be strobed or otherwise driven with a supply voltage in excess of $V_{DD}$ such as during a switching transition, if desired. In a high voltage compound switch, this can adjust the amount of offset voltage, $V_{gg}$, between the respective gates of the FET 202 and the JFET 203. If it is additionally or alternatively desired to use the coupling transistor 625 to allow a desired fraction of the JFET 203's gate current to be coupled to the gate of the FET 202, such as in a selected one or both switching transitions, the current gain (beta) can be adjusted by employing a bipolar junction transistor (BJT) or current mirror circuit techniques to synthesize a reduced-beta transistor, such as discussed previously in the discussion of FIG. 5.

This can allow, for example, the slew rate of the node 206 to be limited by the current-limited MOSFET driver circuit 104A, when desired, but for the JFET to otherwise be biased by its own JFET driver circuit 104B after the switching transition, while the compound switch 201 remains in either its "on" state or its "off" state. This permits the gate of the JFET 203 to be driven with more positive voltage than the voltage at the source of the JFET 203, such as can help reduce the channel resistance of the JFET 203 and increase its conductance, such as during the "on" state of the compound switch. After this switching transition is over, coupling transistor 625 can be disabled, thereby allowing the driver 104A to fully enhance FET 202 without excess current flowing into the gate of the JFET 203. Thus, FET 202 can be fully enhanced and does not suffer high "on" resistance.

Driver 104B can then be permitted to drive the gate of the JFET 203, independently of the voltage at the gate of FET 202. It can be desirable for the gate of the JFET 203 to be somewhat positive, such as to increase or maximize the conductance of the JFET 203, but not to drive it with such a strong current so as to cause excess power loss due to gate diode conduction. Driver 104B can be configured to provide limited current, thereby avoiding excessive power loss while increasing or maximizing the conductance of the JFET 203.

As explained herein, the various techniques for providing coupling circuitry such as can help appropriately control an high-voltage transistor (HVT) and a low-voltage transistor (LVT) of a compound switch can help provide advantages such as can include high voltage switching operation with well-controlled slew rate of the switching node, such as to inhibit or limit EMI that might otherwise be radiated from the circuit, which may be precluded by a governmental regulation or by the needs of a particular application.

Figure 7:
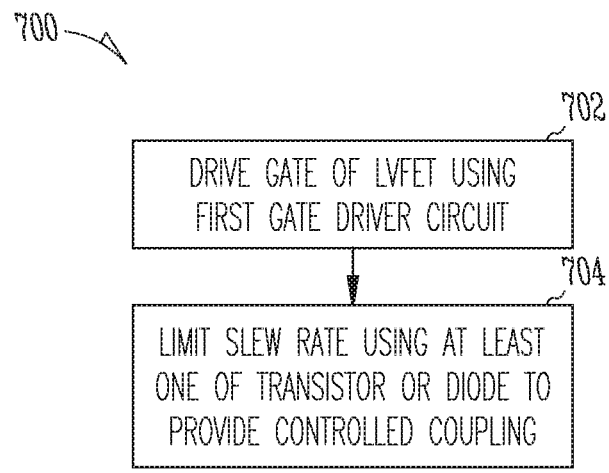
FIG. 7 illustrates an example of aspects of a method of operation according to an illustrative example of the present slew rate control techniques.

FIG. 7 illustrates an example of aspects of a method 700 of operation according to an illustrative example of the present techniques. At 702, a control terminal (e.g., gate terminal) of an LVT (e.g., LVFET) of a compound switch can be driven using a first gate driver circuit, such as gate driver circuit 104, which can be current-limited, as explained herein. At 704, a slew rate of a switching node of the compound switch can be limited, such as by using at least one of a transistor or a diode to provide a controlled coupling between the control terminals of the HVT and the LVT, such as during a switching transition, such as by limiting a charging or discharging of a Miller capacitance $C_{gd}$ of the HVT by a drive-current limit of the current driver circuit being used to drive the LVT.

Figure 8:
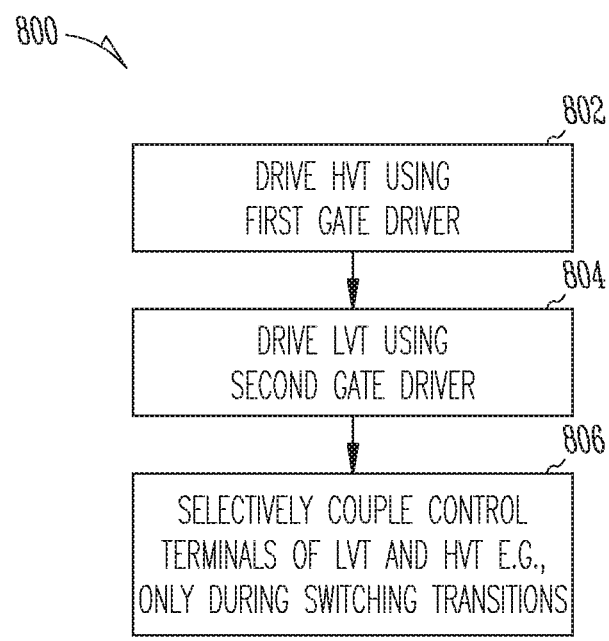
FIG. 8 illustrates an example of aspects of a method of operation according to an illustrative example of the present slew rate control techniques.

FIG. 8 illustrates an example of aspects of a method 800 of operation according to an illustrative example of the present techniques. At 802, a control terminal of an HVT of a compound switch can be driven using a first driver circuit. At 804, a control terminal of an LVT can be driven using a second driver circuit. At 806, a controlled coupling (e.g., via a coupling transistor) can be provided between the control terminals of the LVT and the HVT, e.g., only during switching transitions, if desired, such as by strobing. The coupling transistor control terminal voltage need not be limited by the power supply voltage being provided to one or both of the first and second driver circuits. The power supply of the first and second driver circuits need not be the same; for example, it may be useful to provide the driver circuit coupled to the LVT a higher power supply voltage to provide lower "on" resistance of the LVT.

The cascode compound transistor switching structures described herein with a high voltage transistor (HVT) in series with a normally-off low voltage transistor (LVT) can be configured such that the HVT's charge is coupled to the LVT's gate, such as using one or more transistors, one or more diodes, or a combination, such as to allow controlling the HVT's drain dV/dt, while allowing the HVT and LVT to have different gate voltages. The compound transistor switch can provide different current paths for positive dV/dt and negative dV/dt switching transitions at the switching node of the switch, for example, such that a first path can feed its charge to the LVT's gate, while the another, second, path does not, thereby allowing asymmetric dV/dt control if desired. The compound transistor can be configured to couple a desired fraction of the HVT's gate current to the LVT's gate in one or both switching transitions, as explained herein. The current fed to the gate of the LVT switching transistor can be limited in a manner so as to control the HVT's dV/dt, as explained herein. A coupling transistor can be provided, such as can be driven actively (e.g., strobed or otherwise briefly turned-on in a controlled fashion) such as only during switching transitions, such as to dynamically control the coupling during the switching transitions, while allowing independent control of the control nodes of the HVT and the LVT when the compound switch is not undergoing a switching transition but instead remains in one of its "on" or "off" states. Further, the HVT gate can be driven to an more positive voltage than its source node-independent from a positive voltage level being used to control the LVT, such as to improve "on" state conductance of the HVT.

Controlling Forward-Biasing of Gate-Source Junction Diode of JFET Cascode HVT

JFETs are usually depletion-mode (i.e., normally-on) devices, meaning that when the gate-source voltage ($V_{GS}$) of the JFET is zero, a conductive channel exists between the drain and source conduction terminals of the JFET, such that a large drain-source current (Irs) can flow between such drain and source conduction terminals of the JFET with very little drain-source voltage drop ($V_{DS}$). In order to turn off a depletion mode (normally-on) JFET, a negative $V_{GS}$ must be applied to deplete the conductive channel of charge carriers so that the current $I_{DS}$ becomes zero, thereby allowing the drain-source voltage $V_{DS}$ to become large.

For power electronics circuitry, a "normally-on" characteristic can be undesirable. For example, if the power electronics circuit is energized before the control circuit assumes control, e.g., at a power-up or reset condition, then the "normally-on" switch may conduct a large and uncontrolled current and may even be destroyed as a result. Thus, a "normally-off" characteristic may be desired. This can be achieved by adding a "normally-off" low-voltage transistor (LVT) in series with the "normally-on" JFET high-voltage transistor (HVT) in a compound switch arrangement.

Returning to FIG. 2, as shown, when using a "normally-on" JFET 203 as a cascode HVT device in series with a LVT FET 202 in a compound switch 201, the gate-source voltage of the JFET 203 can be driven to zero volts when the compound switch 201 is in an "on" state, with both JFET 203 and LVT FET 202 turned on and conducting. This can be accomplished by electrically connecting the gate terminal of JFET 203 to the source terminal of the FET 202. In such a state, the gate-source junction diode of the JFET 203 is not forward-biased.

While using a "normally-off" JFET for the JFET 203 could avoid the need for using the series-connected "normally off" LVT FET 202 for switching using a positive-going control voltage drive signal, such normally-off JFETs are more complicated, expensive to manufacture, and uncommon, and, for many applications, can be cost-prohibitive.

The present inventors have also recognized, among other things, that although applying a positive gate drive voltage to the gate of the cascode HVT JFET 203 (i.e., positive with respect to the source of the JFET 203, such as to forward-bias the gate-source junction diode of the JFET 203) does not add to the commutative behavior of the circuitry shown in FIG. 2 using a "normally-on" JFET 203, doing so can still have value. More particularly, doing so can significantly improve the conduction of the JFET 203, such as when the compound switch 201 is in the "on" state. It can reduce the on-state resistance of the JFET 203 and can advantageously help increase the value of the drain-source current $I_{DS}$ of the JFET 203 at which the JFET 203 leaves its "linear" region of operation and enters its "saturation" region of operation.

Returning to FIG. 6, a driver circuit for JFET 203 can be employed to forward-bias the JFET 203's gate during compound switch 201's on-state.

In such a state in which the gate-source junction of the JFET 203 is forward-biased, such forward-biased junction voltage (or the corresponding gate current) of the JFET 203 can also be used as an indication of the temperature of the JFET 203. The forward-biased junction voltage $V_{GS}$ of the JFET 203 is complementary to absolute temperature (CTAT). Further, the temperature of the JFET 203 can be used as an indication of how well or how efficiently the JFET 203 and, in turn, the compound switch 201 is operating in a given circuit application, such as at a particular power level in a switched-mode power electronics or other circuit. For example, the indication of the temperature of the JFET 203 can be used to provide an alert, such as of a fault condition, such as when the indication of the temperature of the JFET 203 exceeds a specified threshold value or when it changes by more than a specified amount. Operating the compound switch 201 with forward-biasing of the gate-source junction diode of the JFET 203 should be carefully controlled, however, to avoid degrading or burning out the JFET 203 component. Some examples of driving the gate of a "normally-on" JFET 203 to a positive $V_{GS}$, such as to help obtain one or more resulting benefits, e.g., of a reduced on-state resistance, increased saturation current, temperature-sensing ability, and doing so in a manner that can avoid excessive power loss by forward-biasing the gate-source junction diode of the JFET 203, are explained further below.

Figure 9A:
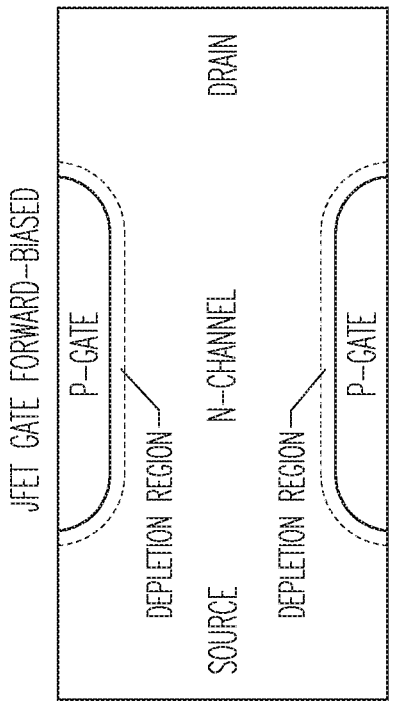
FIG. 9A ($V_{GS}=0V$) and FIG. 9B ($V_{GS}>0V$, gate-source junction diode forward-biased) show conceptualized cross-sectional views of a JFET illustrating the effect of gate drive voltage on a JFET in its ohmic region of operation.
Figure 9B:
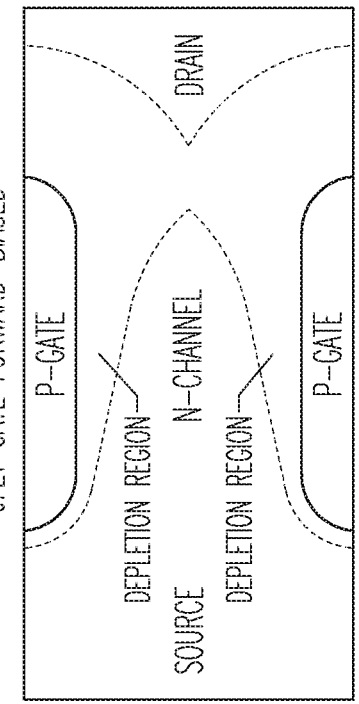

FIG. 9A ($V_{GS}$=0V) and FIG. 9B ($V_{GS}$>0V, gate-source junction diode forward-biased) show conceptualized cross-sectional views of the JFET 203, illustrating the effect of gate drive voltage on a JFET in its ohmic region of operation, e.g., when the voltage across the conduction terminals $V_{DS}$ of the JFET is small. In this example, the source, drain, and channel regions of the JFET device are N-doped, providing free electrons for conduction in the channel region, while the gate is P-doped, providing a control terminal for the JFET device. The cross-sectional girth of the channel dictates the JFET device's on-state resistance. A larger girth allows more drain-source current conduction, thereby lowering the on-state resistance of the JFET. It is by applying sufficient negative voltage to the gate-source PN junction diode that this "normally-on" JFET transistor can be turned off, because the channel thereby becomes depleted of free electrons. FIG. 9A shows a JFET in its on-state, with zero gate-source voltage, $V_{GS}$=0. Even though the JFET is "on", the channel is partially depleted due to the formation of the PN junction's built-in potential. FIG. 9B shows the same JFET with a positive forward-bias applied to the gate terminal with respect to the source terminal of the JFET device. Applying such a positive bias voltage to the gate reduces the junction's built-in potential, causing the depletion region to diminish and the channel girth to enlarge. Thus, a positive gate bias lowers the JFET's on-state resistance.

Figure 10A:
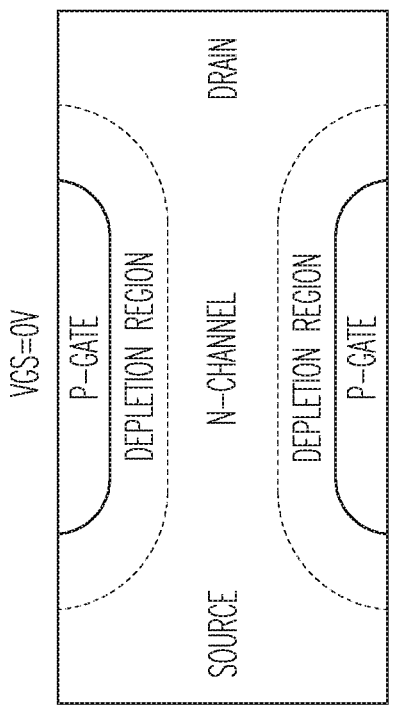
FIG. 10A ($V_{GS}=0V$) and FIG. 10B ($V_{GS}>0V$, gate-source junction diode forward-biased) show conceptualized cross-sectional views of the JFET, illustrating the effect of gate drive voltage on a JFET in its saturation region of operation.
Figure 10B:
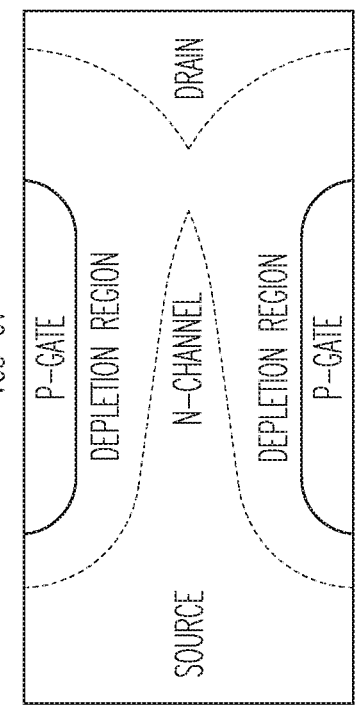

FIG. 10A ($V_{GS}$=0V) and FIG. 10B ($V_{GS}$>0V, gate-source junction diode forward-biased) show conceptualized cross-sectional views of the JFET, illustrating the effect of gate drive voltage on a JFET in its saturation region of operation, when $V_{DS}$ is large. The positive gate bias of FIG. 10B is illustrated as corresponding to a larger channel girth than exists for the zero gate bias of FIG. 10A. Thus, a positive gate bias yields a larger saturation current in the saturation region of operating the JFET, relative to the zero gate bias voltage condition.

Figure 11:
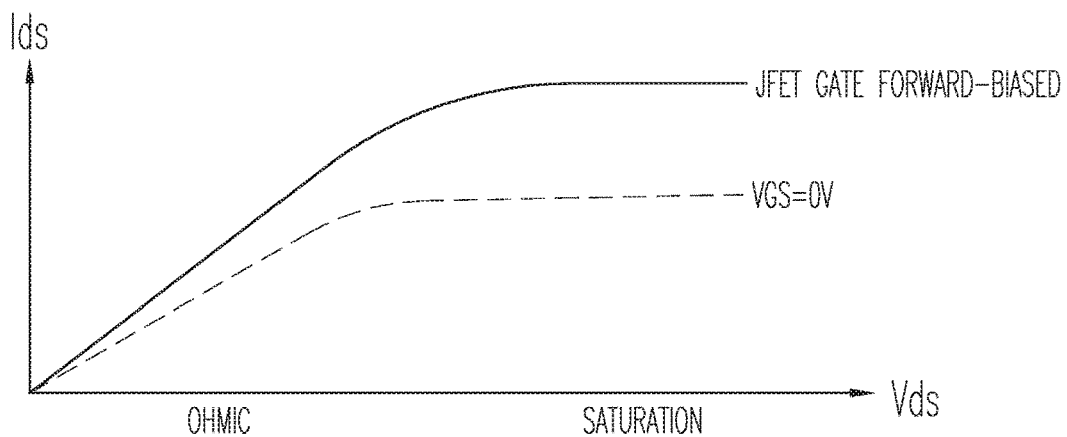
FIG. 11 is a graph showing conceptualized $I_{DS}$ vs. $V_{DS}$ characteristic curves for different values of gate-source voltage, $V_{GS}$, with the dashed curve indicating $V_{GS}=0$ and the solid curve indicating $V_{GS}>0$ at a value that forward-biases the gate-source junction diode of the JFET.

FIG. 11 is a graph showing conceptualized current $I_{DS}$ vs. voltage $V_{DS}$ characteristic curves for different values of gate-source voltage, $V_{GS}$, with the dashed curve indicating $V_{GS}$=0 and the solid curve indicating $V_{GS}$>0 at a value that forward-biases the gate-source junction diode of the JFET. As shown in FIG. 11, for low values of $V_{DS}$, in the ohmic regime of JFET operation, a positive gate-source bias voltage increases the drain-source current $I_{DS}$ for a given $V_{DS}$. This increased $I_{DS}/V_{DS}$ slope implies a lower on-state resistance in the ohmic region, such as can be observed in FIG. 11 for the $V_{GS}$>0 relative to the $V_{GS}$=0 condition. This lower on-state resistance allows the JFET to operate more efficiently in the ohmic region when $V_{GS}$>0 than when $V_{GS}$=0. At large drain-source voltage, $V_{DS}$, in the saturation regime of JFET operation, a positive gate-source bias voltage, $V_{GS}$>0, increases the saturation current $I_{DS}$ relative to the $V_{GS}$=0 condition. This can help enable the JFET device to deliver more power to a circuit without the risk of overheating, since it remains ohmic over a larger range of currents.

The onset of the saturation region also advantageously occurs at a higher value of $V_{DS}$ when $V_{GS}>0$ than when $V_{GS}=0$.

Figure 12A:
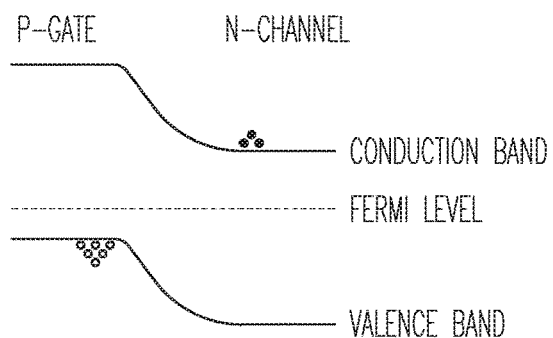
FIG. 12A shows (for $V_{GS}=0V$) a conceptualized energy band diagram of the JFET's gate-to-source PN junction.

FIG. 12A shows (for $V_{GS}=0V$) a conceptualized energy band diagram of the JFET's gate-to-source PN junction, showing valence band edge, conduction band edge, and Fermi energy levels. With zero applied voltage, the Fermi energy is constant throughout the device, such that the built-in potential barrier appears within the JFET device's gate-source PN junction; the span over which the potential changes dictates the extents of the depleted region.

Figure 12B:
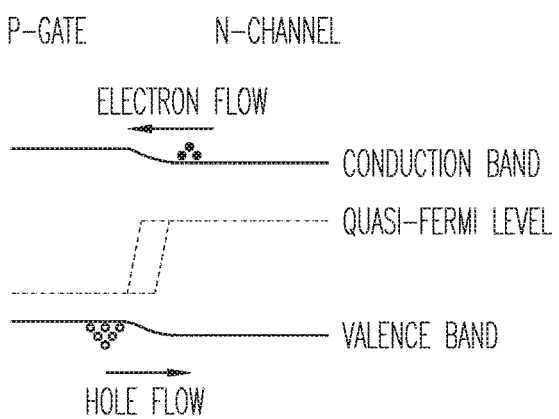
FIG. 12B shows (for $V_{GS}>0V$) a conceptualized energy band diagram of the JFET's gate-to-source PN junction.

FIG. 12B shows (for $V_{GS}>0V$) a conceptualized energy band diagram of the JFET's gate-to-source PN junction, showing valence band edge, conduction band edge, and Fermi energy levels. This positive applied voltage lowers the built-in potential barrier of the JFET's PN junction, reducing the extents of the depleted region and increasing the channel's girth. Additionally, this reduction of built-in potential causes some conduction of holes from the gate to the channel region and of electrons from the channel region to the gate region. Excessive conduction can be undesirable, because it can result in heat generation and possible damage to the JFET. However, a modest amount of conduction is useful; it indicates that the built-in potential has been largely counteracted by the applied positive voltage. Because the built-in potential depends upon temperature, a measurement of the applied voltage that results in such modest gate current conduction can be used as an indication of JFET temperature, which can be useful to monitor such as for fault-indication, for aging-indication, or for another purpose.

Figure 13:
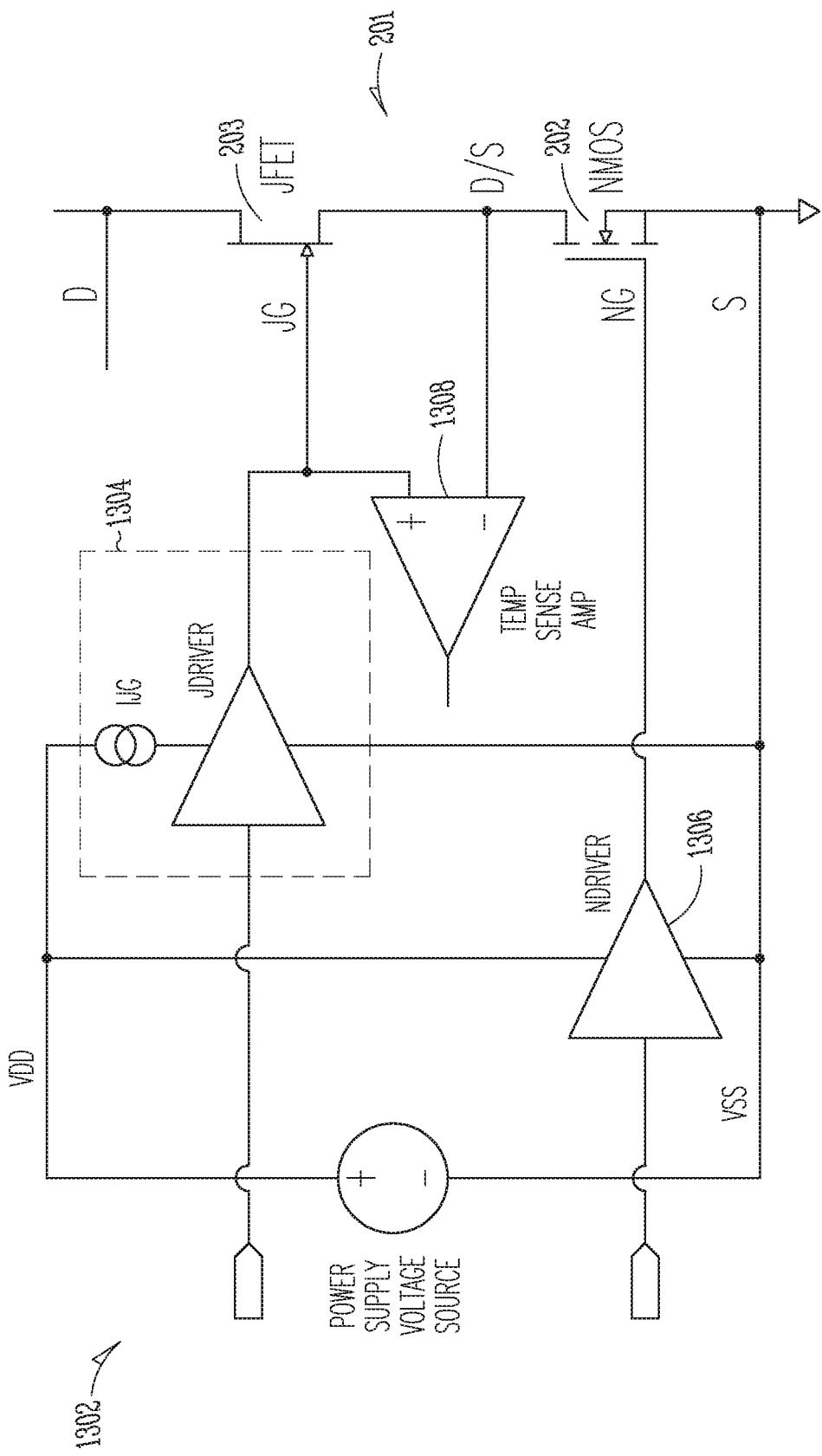
FIG. 13 is a circuit schematic diagram illustrating an current-control example in which a compound switch can be biased so as to forward-bias a gate-source junction diode of the JFET when the cascode compound switch is in an "on" state.

FIG. 13 is a circuit schematic diagram illustrating an example in which the compound switch 201 can be biased by biasing circuitry 1302 that can include a HVT gate driver circuit 1304, including an output terminal coupled to the gate of the JFET 203, with the HVT gate driver circuit 1304 configured to bias the gate of the JFET 203 so as to forward-bias a gate-source junction diode of the JFET 203 when the cascode compound switch 201 is in an "on" state. The HVT gate driver circuit 1304 can include at least one of JFET gate bias voltage control circuitry or JFET gate bias current control circuitry to control an amount of the forward-bias of the gate-source junction diode of the JFET 203 when the cascode compound switch 201 is in the "on" state. In the example of FIG. 13, the HVT gate driver circuit 1304 can include a current-limiting circuit, such as depicted by the current source $I_{JG}$, which can be configured to limit a gate current of the JFET 203 when the gate-source junction diode of the JFET 203 is forward biased when the cascode compound switch 201 is in the "on" state, as explained further herein.

In the example of FIG. 13, the biasing circuitry 1302 can include a HVT gate driver circuit 1304 configured to bias the gate of the "normally-on" or depletion mode JFET 203, which can be separate from a LVT gate driver circuit 1306, which can be configured to bias the gate of the "normally-off" or enhancement mode LVT FET 202, although for commutating the compound switch 201, their switch timings can largely coincide. Both the HVT gate driver circuit 1304 and the LVT gate driver circuit 1306 can have high input impedances and can be powered from an upper power supply rail, VDD, and a lower power supply rail, VSS, which can be ground or another reference node. While the LVT gate driver circuit 1306 can have a low output impedance, the HVT gate driver circuit 1304 can have an output impedance determined or dominated by the output impedance of the current-limiting current source $I_{JG}$, shown in FIG. 13. By current limiting the gate current of the JFET 203 to the limited current of the current limiting current source $I_{JG}$, excess power dissipation in the JFET 203 when its gate-source junction is forward biased can be avoided or limited, such as to a specified value. Because the gate current of the JFET 203 forward-biases the gate-to-source and gate-to-channel junction of the JFET 203, depletion of the JFET's channel can be reduced or minimized, such as relative to the $V_{GS}=0$ condition. This can help "open" the channel or improve channel girth, such as explained above, and can help increase, improve, or maximize conductance from the drain of the JFET 203 to the source of the JFET 203. Conductivity modulation may help further improve such drain-source conduction of the JFET 203 with $V_{GS}>0$. More particularly, by forward biasing the PN junction diode of JFET 203, the gate will inject holes into the channel region, to cause the conductivity of the JFET to increase. As a result of the additional holes, additional electrons reside in the channel region to maintain quasi-neutrality, and those additional electrons can enhance drain-source conductivity.

During switching of the compound switch 201, it may be desirable for Ijg to have a larger value (e.g., 2×, 10×, 100×, 1000×, or more) when switching the compound switch 201 from "off" to "on" to help quickly charge the gate capacitance of the JFET 203, such as to help bring the JFET 203 quickly to its condition of increased or maximal conductance, which can improve operating efficiency of the compound switch 201. Thus, the current value of the current-limited current source $I_{JG}$ may be dynamically controlled, such as to provide the larger current during the switching-on transition, and reducing the gate current of the JFET 203 to a lower value for all or a portion of the following "on" period of the JFET 203. The duration of this larger-valued current can be a fixed duration value, or can be an adaptive duration value, such as by using a timer circuit, a voltage detector circuit, or a similar form of state estimator capable of distinguishing between the "switching-on" and "on" state of the compound switch 201 or, more particularly, of the JFET 203.

In the example shown in FIG. 13, it can be noted that the LVT FET 202 and its LVT gate driver circuit 1306 can be primarily responsible for commutating the compound switch 201 between its "on" and "off" states. The HVT gate driver circuit 1304 can be primarily responsible for enhancing the conductance of the JFET 203 in its "on" state. Thus, in terms of timing operation of the HVT JFET 203 and the LVT FET 202 in the compound switch 201, control circuitry providing and timing the control signals to the LVT gate driver circuit 1306 and the HVT gate driver circuit 1304 can be configured with turn-off timing provided so as to begin turning off the JFET 203 while the FET 202 is still on, so that charge accumulated in the channel region of the JFET 203 can be discharged via the "on" FET 202, rather than via the drain of the JFET 203 and via circuitry connected thereto, and then turning off the FET 202. Such timing of "on" to "off" switching can be accomplished by the control circuitry including non-overlapping clock circuitry or the like.

FIG. 13 also illustrates an example of inclusion of a temperature sensing circuitry, such as a temperature sensing amplifier 1308, which is shown with its inverting input terminal being electrically connected or coupled to the source terminal of the JFET 203 and its non-inverting input being electrically connected or coupled to the gate terminal of the JFET 203. By measuring the gate-source voltage $V_{GS}$ of the JFET 203 in this or a similar manner, an indication of temperature can be generated, such as can be made available via the resulting output of the temperature sensing amplifier 1308, in the example shown in FIG. 13. When the gate-source junction of the JFET 203 is forward-biased with a modest gate current through the JFET 203, $V_{GS}$ of the JFET 203 is determined by the conduction of its gate-to-source PN junction diode. Because this diode's current-voltage relationship varies predictably with temperature, the sensed $V_{GS}$ is an indicator of the temperature of the JFET 203. Such temperature information can be used, for example, for detecting an over-temperature fault condition, such as by comparing a voltage output by the temperature sense amplifier to a fixed or programmable fault-condition reference voltage, such as by using a comparator circuit, for example. In another example, this temperature information can be used, e.g., in a closed-loop fashion, to vary operational control of the compound switch 201 in a manner that can improve or optimize its operating efficiency, e.g., in its "on" state, such as by adjusting one or more control parameters in a manner that tends to reduce the temperature monitored by the temperature sensing amplifier 1308. Because such temperature-based efficiency information is present only while the compound switch 201 and, more particularly, the JFET 203, is "on", a memory circuit can be included to help capture and store such information, such as to retain such information when the JFET 203 is "off". The sensed temperature output by the temperature sensing amplifier 1308 can be processed in one of any number of manners, such as can include storing using sample/hold circuitry, converting the information into a pulse-width modulated (PWM) or other signal, or digitizing the information, such as using an analog-to-digital converter (ADC) circuit.

Figure 14:
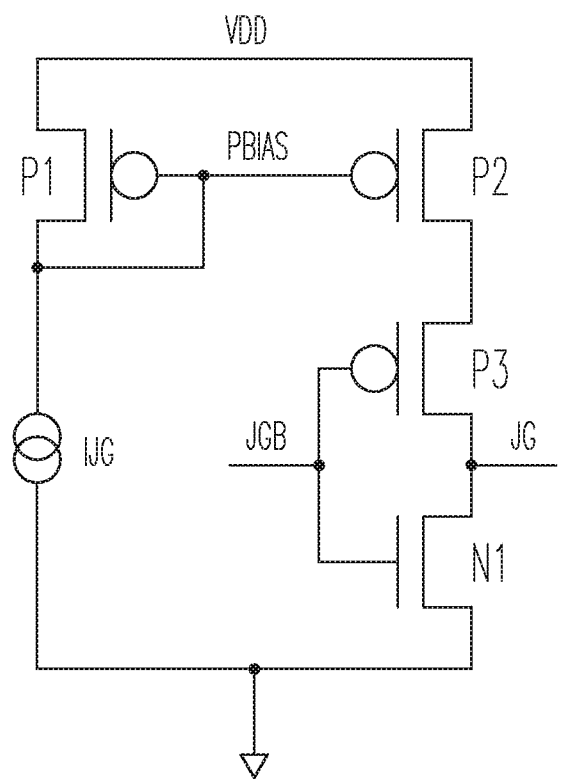
FIG. 14 illustrates an example of current-limited HVT driver circuitry such as can be used in the current-control example of FIG. 13.

FIG. 14 illustrates an example of the HVT driver circuitry 1304, such as can include an inverter circuit (P3, N1) such as can be connected to an upper power supply rail VDD via a current mirror output transistor P2 of a current mirror circuit (P1, P2) such as can be biased by a reference current source or sink $I_{JG}$. Thus, in the example of FIG. 14, the transistors P3 and N1 can be responsible for switching, while the current mirror circuit transistors P1 and P2 can control the pull-up current that will ultimately be provided to the gate of the JFET 203. Transistor size, supply voltage, or both, can additionally or alternatively be varied, such as to bias the gate of the JFET 203 with an appropriately current-limited gate current, such as to avoid wear or damage to the JFET 203.

Figure 15:
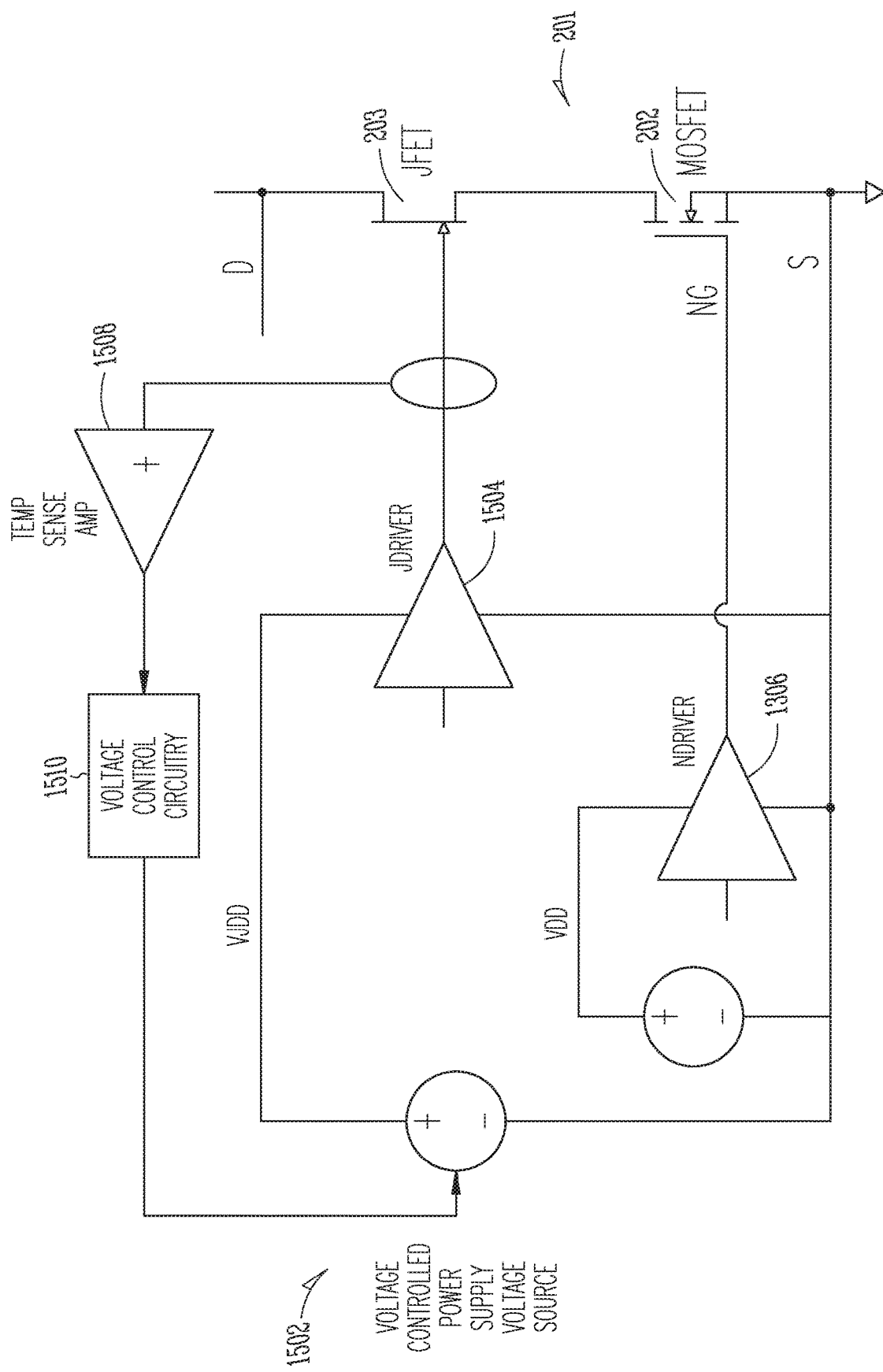
FIG. 15 is a circuit schematic diagram, similar to that shown in FIG. 13, but using fixed or adaptive bias voltage control of the gate voltage of the JFET.

FIG. 15 is a circuit schematic diagram, similar to that shown in FIG. 13, using bias voltage control of the gate voltage of the JFET 203 such as for controllably forward-biasing the gate-source junction of the JFET 203. In the example of FIG. 15, the compound switch 201 can be biased by biasing circuitry 1502 that can include a HVT gate driver circuit 1504, including an output terminal coupled to the gate of the JFET 203, with the HVT gate driver circuit 1504 configured to bias the gate of the JFET 203 so as to forward-bias a gate-source junction diode of the JFET 203 when the cascode compound switch 201 is in an "on" state.

Thus, FIG. 15 illustrates that it is possible to limit the gate current of the JFET 203 not by using a current-limited current source, such as shown and described with respect to FIG. 14, but instead driving the gate voltage of the JFET 203 with a carefully-chosen low-impedance voltage source. In the example of FIG. 15, the HVT driver circuitry 1504 need not be current-limited. Instead, the upper power supply voltage rail $V_{JDD}$ that powers the HVT driver circuitry 1504 can be carefully controlled so that when the JFET 203 is "on", it will not conduct excessive current. This can be accomplished sensing the gate current (or an indication thereof) of the JFET 203, and by using such information in a closed-loop servo fashion to adjust the upper power supply voltage rail $V_{JDD}$ such as to obtain a desired value of the gate current of the JFET 203. Instead of directly sensing or measuring gate current, which is possible and envisioned as being within the scope of the present subject matter, an indirect indication of the gate current can alternatively or additionally be used as a control variable to control the voltage of the upper power supply voltage rail $V_{JDD}$, such as using temperature as such an indirect indication, using a temperature sensing amplifier 1508 similar to the technique described above with respect to FIG. 13. The temperature information output by the temperature sensing amplifier 1508 can be provided to voltage control circuitry 1510, which can use such input information to generate an output control signal to control a voltage-controlled voltage source generating $V_{JDD}$. The LVT driver circuitry 1306 can be powered from a separate upper power supply voltage rail that can provide an upper power supply voltage $V_{DD}$ that need not depend upon the gate current of the JFET 203. Additionally or alternatively, a gate current sensor circuit can be used, and the sensed gate current can be used to provide an indication of the temperature of the JFET 203.

Figure 16A:
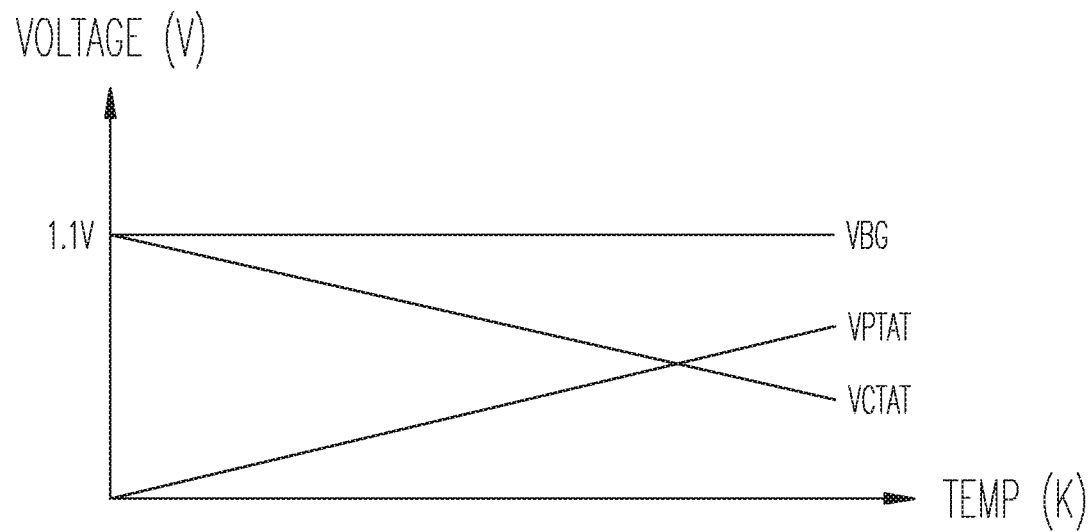
FIGS. 16A-16B illustrate conceptually an example of a technique of synthesizing a fixed voltage $V_{JDD}$, without requiring closed-loop feedback servo control.
Figure 16B:
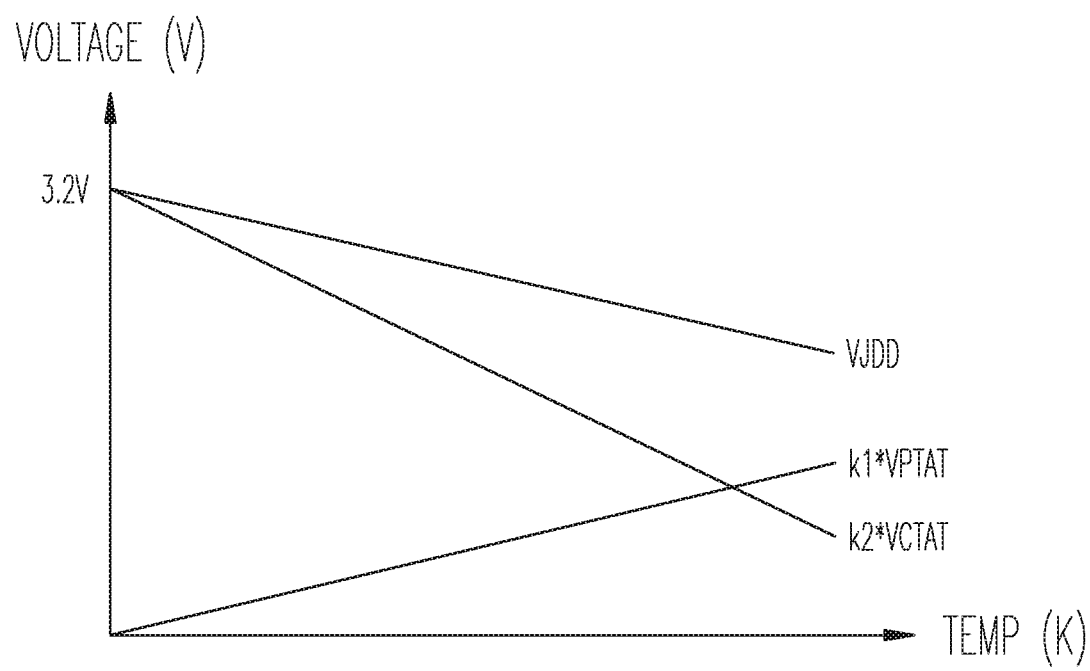

FIGS. 16A-16B illustrate conceptually an example of a technique of synthesizing a fixed voltage $V_{JDD}$, without requiring closed-loop feedback servo control as shown in FIG. 15. FIG. 16A illustrates a concept employed in a bandgap voltage reference within an integrated circuit. A proportional to absolute temperature (PTAT) voltage $V_{PTAT}$ (such as can be based on a difference between voltages across PN junction diodes of different current densities) can be summed with a complementary to absolute temperature (CTAT) voltage $V_{CTAT}$ (such as can be based on a voltage across a single PN junction diode on the same integrated circuit). The sum of the CTAT and PTAT voltages can be largely temperature invariant at a particular operating voltage, which is shown as the bandgap voltage $V_{BG}$ in FIG. 16A. FIG. 16B shows how this technique can be employed for generating $V_{JDD}$, assuming for illustrative purposes that the JFET is composed of silicon carbide, for which the bandgap voltage, $V_{BG}$, is 3.2 Volts. As shown in FIG. 16B, a voltage that mimics the JFET's PN junction diode voltage can be synthesized, such as by using respective amplifiers to scale $V_{PTAT}$ and $V_{CTAT}$ with appropriate scaling constants $k_1$ and $k_2$, respectively. This arrangement can assume that the JFET (on a SiC die) is physically located close to the other circuitry, which may be on a separate Si integrated circuit, so that these two respective circuits can be assumed to have similar temperatures, such that the resulting JFET gate current can indicate a difference in temperature between these two circuits.

In a further example to the examples described herein including temperature monitoring, the compound switching circuitry can further include wireless or wired communication circuitry such as to communicate information about the temperature or another JFET parameter to a local or remote monitoring interface circuit, such as can be used to provide an indication of at least one of JFET temperature, JFET operation, JFET aging, cascode compound switch operation, or cascode compound switch aging.

In a further example to the examples described herein, the switching circuitry can include load current monitoring circuitry to monitor a load current through the compound switch. Control circuitry can be coupled to the load current monitoring circuitry, and can be configured to control at least one of a JFET gate bias voltage, a JFET gate current bias, or a switch timing control signal of at least a portion of the compound switch based at least in part on the load current. For example, under high load current conditions, it may be desirable to have a lower on-state resistance of the JFET 203 and, therefore, to bias the JFET 203 with a larger gate current than for a lower load current condition. Similarly, it may be desirable to switch more quickly into a lower on-state resistance of the JFET 203 under a higher load current, such that the off-to-on transition current under a high load current condition may be allowed to be higher at higher load current conditions.

It should be recognized that the switching circuitry described herein can be included in or in combination with at least one of switched-mode power supply circuitry, power-supply disconnect circuitry, motor driver circuitry, or electromechanical transducer driver circuitry.

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. Switching circuitry providing slew-rate control, the switching circuitry comprising:
    a slew-rate controlled cascode compound switch comprising:
    a normally-off low voltage transistor (LVT), including drain, source, and gate terminals; and
    a normally-on cascode high voltage transistor (HVT), including drain, source, and gate terminals, in series with the LVT to form the compound switch;
    a first gate driver circuit, including an input terminal coupled to receive an input signal and an output terminal coupled to the gate of the LVT;
    coupling circuitry, coupled between the gate driver output and the gate of the HVT to drive a drain-gate capacitance of the HVT to limit a slew rate of a switching signal across the compound switch by a drive current characteristic of the first gate driver circuit during at least one of a turn-on or a turn-off of the compound switch; and
    wherein the coupling circuitry includes a coupling transistor including a first conduction terminal coupled to the gate of the HVT and a second conduction terminal coupled to the gate of the LVT to provide a controlled electrical conduction coupling path between respective gates of the LVT and the HVT.

2. The apparatus of claim 1, in which the coupling circuitry includes an offset voltage circuit coupled to the gate of the HVT to provide an offset voltage to inhibit gate-source conduction of the HVT in response to a signal at the gate driver output that biases the LVT on.

3. The apparatus of claim 2, in which the coupling circuitry includes at least one p-n semiconductor junction providing the offset voltage.

4. The apparatus of claim 3, in which the coupling circuitry includes at least one or a series of diodes providing the offset voltage.

5. The apparatus of claim 1, in which the coupling circuitry comprises anti-parallel first and second diodes respectively coupled to the gate of the HVT.

6. The apparatus of claim 1, in which the HVT is a JFET and in which the LVT is a MOSFET.

7. The apparatus of claim 1, in which the coupling circuitry includes different first and second current paths coupled to the gate driver output, only one of which is active to provide charge to the gate of the HVT during one of a turn-on transition or a turn-off transition of the compound switch.

8. The apparatus of claim 1, in which the coupling circuitry includes at least one of:
  at least one transistor or at least one diode, to couple the gate of the HVT to the gate driver output.

9. The apparatus of claim 1, in which the coupling circuitry includes a coupling transistor between the gate driver output and the gate of the HVT, and including a second gate driver coupled to the gate of the HVT.

10. The switching circuitry of claim 1, further comprising:
  a second gate driver circuit, including an input terminal coupled to receive a second input signal and an output terminal coupled to the gate of the HVT to permit driving the gate of the HVT to a more positive voltage than a source of the HVT during an "on" state of the compound switch.

11. A method of switching to control electrical conduction between first and second nodes separated by a cascode compound switch that includes a higher voltage transistor (HVT) in series with a lower voltage transistor (LVT), the method comprising:
  using a first gate driver circuit, driving the gate of the LVT;
  limiting a switching slew rate of one of the first and second nodes, using at least one of a transistor or a diode for providing controlled coupling between the gates of the HVT and the LVT; and
  using at least one coupling transistor, selectively coupling the gate of the LVT to the gate of the HVT during switching transitions of the compound switch and isolating the gate of the LVT from the gate of the HVT otherwise.

12. The method of claim 11, wherein limiting the switching slew rate comprises charging or discharging a gate-drain capacitance of the HVT by a current limited by the gate driver circuit.

13. The method of claim 11, comprising limiting the switching slew rate of one of the first and second nodes during only one of turn-on or turn-off switching transitions of the compound switch.

14. The method of claim 11, comprising limiting the switching slew rate of one of the first and second nodes asymmetrically with respect to turn-on and turn-off transitions of the compound switch.

15. The method of claim 11, comprising providing an offset voltage between gates of the LVT and the HVT to limit or inhibit gate-source conduction of the HVT in response to a gate driver signal that biases the LVT on.

16. A method of slew-rate limited switching between first and second nodes separated by a cascode compound switch that includes a higher voltage transistor (HVT) in series with a lower voltage transistor (LVT), the method comprising:
  using a first gate driver circuit, driving a gate of the LVT;
  using a coupling transistor, selectively coupling the gate of the LVT to the gate of the HVT during switching transitions of the compound switch and isolating the gate of the LVT from the gate of the HVT otherwise; and
  using the coupling transistor, selectively coupling the gate of the LVT to the gate of the HVT during switching transitions of the compound switch and isolating the gate of the LVT from the gate of the HVT otherwise.

17. The method of claim 16, further comprising:
  using a second gate driver circuit, driving a gate of the HVT.

18. The method of claim 16, wherein the coupling charges or discharges a gate-drain capacitance of the HVT using a current provided and limited by the first gate driver circuit.

19. The method of claim 16, wherein a specified offset voltage or fraction of a gate current of the HVT is coupled to a gate of the LVT during the selective coupling.

20. The method of claim 16, wherein the driving the gate of the HVT comprises driving the gate of the HVT to a voltage that is more positive than a source voltage of the HVT.

21. The method of claim 16, wherein the HVT comprises a SiC, GaN, or other wide-bandgap transistor.

22. The method of claim 16, further comprising:
  using a second gate driver circuit, driving a gate of the HVT, including driving the gate of the HVT to a more positive voltage than a source of the HVT during an "on" state of the compound switch.

* * * * *